(12) United States Patent
Sarkis et al.

(10) Patent No.: US 10,320,428 B2
(45) Date of Patent: Jun. 11, 2019

(54) OUTPUTTING OF CODEWORD BITS FOR TRANSMISSION PRIOR TO LOADING ALL INPUT BITS

(71) Applicant: QUALCOMM Incorporated, San Diego, CA (US)

(72) Inventors: Gabi Sarkis, San Diego, CA (US); Yang Yang, San Diego, CA (US); Jing Jiang, San Diego, CA (US); Jamie Menjay Lin, San Diego, CA (US); John Edward Smee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/616,792

(22) Filed: Jun. 7, 2017

(65) Prior Publication Data

US 2018/0048334 A1    Feb. 15, 2018

Related U.S. Application Data

(60) Provisional application No. 62/443,541, filed on Jan. 6, 2017, provisional application No. 62/375,335, filed on Aug. 15, 2016.

(51) Int. Cl.
*H03M 13/00* (2006.01)
*H03M 13/37* (2006.01)
(Continued)

(52) U.S. Cl.
CPC ....... *H03M 13/3761* (2013.01); *H03M 13/13* (2013.01); *H03M 13/611* (2013.01);
(Continued)

(58) Field of Classification Search
CPC .......... H03M 13/3761; H03M 13/6525; H04L 1/0041; H04L 1/0057
See application file for complete search history.

(56) References Cited

U.S. PATENT DOCUMENTS 9,164,835 B2 * 10/2015 Lee ..................... G06F 11/1068
9,467,164 B2 * 10/2016 Ionita .................. H04L 25/4917
(Continued)

OTHER PUBLICATIONS

Arikan E., "Channel Polarization: a Method for Constructing Capacity-Achieving Codes for Symmetric Binary-Input Memoryless Channels," IEEE Transactions on Information Theory, vol. 55 (7), Jul. 24, 2008, pp. 3051-3073, XP080428257.
(Continued)

*Primary Examiner* — Esaw T Abraham
(74) *Attorney, Agent, or Firm* — Holland & Hart LLP

(57) ABSTRACT

Methods, systems, and devices for outputting of codeword bits for transmission prior to loading all input bits. An example encoder may have multiple encoding branches. The encoder may divide the encoding branches into first and second encoding branch subsets, outputs of the first encoding branch subset being independent of inputs to the second encoding branch subset. The encoder may generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset. The encoder may output the first subset of output bits prior to outputting the second subset of output bits.

28 Claims, 20 Drawing Sheets

(51) Int. Cl.
  *H04L 1/00* (2006.01)
  *H03M 13/13* (2006.01)
(52) U.S. Cl.
  CPC ...... *H03M 13/6525* (2013.01); *H04L 1/0041* (2013.01); *H04L 1/0057* (2013.01); *H04L 1/0058* (2013.01)

(56) References Cited

U.S. PATENT DOCUMENTS

| | | | | |
|---|---|---|---|---|
| 9,497,478 | B2* | 11/2016 | Ostrovskiy | H04N 19/50 |
| 9,503,513 | B2* | 11/2016 | Alnafoosi | H04L 67/10 |
| 2015/0091742 | A1* | 4/2015 | Ionita | H03M 5/18 |
| | | | | 341/57 |
| 2015/0333775 | A1* | 11/2015 | Korb | H03M 13/45 |
| | | | | 714/780 |

OTHER PUBLICATIONS

Huawei, et al., "Overview of Polar Codes," 3GPP Draft; R1-162161, 3rd Generation Partnership Project (3GPP), Mobile Competence Centre; 650, Route Des Lucioles Centre; 650, Route Des Lucioles; F-06921 Sophia-Antipolis Cedex; France, vol. RAN WG1, Apr. 11, 2016-Apr. 15, 2016, Apr. 2, 2016, XP051080007, 7 pages, Retrieved from the internet: URL: http://www.3gpp.org/ftp/tsg_ran/WG1_RL1/TSGR1_84b/Docs/ [retrieved on Apr. 2, 2016].
International Search Report and Written Opinion—PCT/US2017/045596—ISA/EPO—dated Oct. 13, 2017.

* cited by examiner

| Rate | $x_{120}, x_{127}$ | $x_{112}, x_{119}$ | $x_{104}, x_{111}$ | $x_{96}, x_{103}$ | $x_{88}, x_{95}$ | $x_{80}, x_{87}$ | $x_{72}, x_{79}$ | $x_{64}, x_{71}$ | $x_{56}, x_{63}$ | $x_{48}, x_{55}$ | $x_{40}, x_{47}$ | $x_{32}, x_{39}$ | $x_{24}, x_{31}$ | $x_{16}, x_{23}$ | $x_{8}, x_{15}$ | $x_{0}, x_{7}$ |
|---|---|---|---|---|---|---|---|---|---|---|---|---|---|---|---|---|
| 22/128 = 1/6 | 7 | 4 | 4 | 1 | 4 | 1 | 0 | 0 | 1 | 0 | 0 | 0 | 0 | 0 | 0 | 0 |
| 32/128 = 1/4 | 8 | 6 | 4 | 1 | 4 | 1 | 1 | 0 | 4 | 1 | 1 | 0 | 1 | 0 | 0 | 0 |
| 44/128 = 1/3 | 8 | 7 | 7 | 4 | 7 | 3 | 1 | 0 | 4 | 1 | 1 | 0 | 1 | 0 | 0 | 0 |
| 64/128 = 1/2 | 8 | 8 | 8 | 4 | 7 | 4 | 4 | 1 | 7 | 4 | 4 | 1 | 4 | 0 | 0 | 0 |
| 85/128 = 2/3 | 8 | 8 | 8 | 7 | 8 | 7 | 7 | 3 | 8 | 7 | 7 | 1 | 4 | 1 | 1 | 0 |
| 96/128 = 3/4 | 8 | 8 | 8 | 8 | 8 | 8 | 7 | 4 | 8 | 7 | 7 | 4 | 7 | 3 | 1 | 0 |

FIG. 8

| Rate | $c_{120},$ $c_{127}$ | $c_{112},$ $c_{119}$ | $c_{104},$ $c_{111}$ | $c_{96},$ $c_{103}$ | $c_{88},$ $c_{95}$ | $c_{80},$ $c_{87}$ | $c_{72},$ $c_{79}$ | $c_{64},$ $c_{71}$ | $c_{56},$ $c_{63}$ | $c_{48},$ $c_{55}$ | $c_{40},$ $c_{47}$ | $c_{32},$ $c_{39}$ | $c_{24},$ $c_{31}$ | $c_{16},$ $c_{23}$ | $c_{8},$ $c_{15}$ | $c_{0},$ $c_{7}$ |
|---|---|---|---|---|---|---|---|---|---|---|---|---|---|---|---|---|
| 22/128 = 1/6 | 4 | 3 | 3 | 1 | 3 | 1 | 1 | 0 | 3 | 1 | 1 | 0 | 0 | 0 | 0 | 0 |
| 32/128 = 1/4 | 7 | 4 | 4 | 1 | 4 | 1 | 1 | 0 | 4 | 1 | 1 | 1 | 1 | 1 | 1 | 0 |
| 44/128 = 1/3 | 7 | 4 | 4 | 2 | 4 | 3 | 3 | 1 | 4 | 3 | 3 | 1 | 1 | 1 | 1 | 0 |
| 64/128 = 1/2 | 7 | 6 | 7 | 4 | 7 | 4 | 4 | 1 | 7 | 4 | 4 | 1 | 3 | 1 | 2 | 1 |
| 85/128 = 2/3 | 8 | 7 | 7 | 4 | 7 | 5 | 6 | 4 | 7 | 5 | 6 | 4 | 4 | 4 | 4 | 1 |
| 96/128 = 3/4 | 8 | 7 | 7 | 6 | 7 | 7 | 7 | 4 | 7 | 7 | 7 | 4 | 7 | 4 | 4 | 3 |

FIG. 11

OUTPUTTING OF CODEWORD BITS FOR TRANSMISSION PRIOR TO LOADING ALL INPUT BITS

CROSS REFERENCES

The present Application for Patent claims priority to U.S. Provisional Patent Application No. 62/375,335 by Sarkis, et al., entitled "Outputting of Codeword Bits For Transmission Prior to Loading all Input Bits," filed Aug. 15, 2016, assigned to the assignee hereof, and U.S. Provisional Patent Application No. 62/443,541 by Sarkis, et al., entitled "Outputting of Codeword Bits For Transmission Prior to Loading all Input Bits," filed Jan. 6, 2017, assigned to the assignee hereof.

INTRODUCTION

The following relates generally to wireless communication, and more specifically to outputting of codeword bits for transmission prior to loading all input bits.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system). A wireless multiple-access communications system may include a number of base stations, each simultaneously supporting communication for multiple communication devices, which may be otherwise known as user equipment (UE).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDPC) codes, and polar codes. A polar code is an example of a linear block error correcting code and is the first coding technique to provably achieve channel capacity. Encoding algorithms require implementation, and existing implementations may have system constraints such as input and output bus widths or finite processing speed. System performance for implementations may be determined by factors such as overhead, coding gain, transmission pipelining, and decoding delay. Existing implementations do not provide satisfactory results for one or more of these factors.

SUMMARY

A method for encoding by an encoder comprising a plurality of encoding branches is described. The method may include dividing the plurality of encoding branches into at least a first encoding branch subset and a second encoding branch subset, outputs of the first encoding branch subset being independent of inputs to the second encoding branch subset, generating first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset, and outputting, from the encoder, the first subset of output bits prior to outputting the second subset of output bits.

An apparatus for encoding is described. The apparatus may include means for dividing a plurality of encoding branches into at least a first encoding branch subset and a second encoding branch subset, outputs of the first encoding branch subset being independent of inputs to the second encoding branch subset, means for generating first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset, and means for outputting the first subset of output bits prior to outputting the second subset of output bits.

Another apparatus for encoding is described. The apparatus may include a processor, memory in electronic communication with the processor, and instructions stored in the memory. The instructions may be operable to cause the processor to divide a plurality of encoding branches into at least a first encoding branch subset and a second encoding branch subset, outputs of the first encoding branch subset being independent of inputs to the second encoding branch subset, generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset, and output the first subset of output bits prior to outputting the second subset of output bits.

A non-transitory computer readable medium for encoding is described. The non-transitory computer-readable medium may include instructions operable to cause a processor to divide the plurality of encoding branches into at least a first encoding branch subset and a second encoding branch subset, outputs of the first encoding branch subset being independent of inputs to the second encoding branch subset, generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset, and output the first subset of output bits prior to outputting the second subset of output bits.

Some examples of the method, apparatus, and non-transitory computer-readable medium described above may further include processes, features, means, or instructions for receiving a first of a plurality of subsets of the information bits of the information bit-vector prior to receiving a last of the plurality of subsets of the information bits of the information bit-vector.

In some examples of the method, apparatus, and non-transitory computer-readable medium described above, the outputting of the first subset of output bits may be performed prior to the receiving of the last of the plurality of subsets of the information bits of the information bit-vector.

Some examples of the method, apparatus, and non-transitory computer-readable medium described above may further include processes, features, means, or instructions for receiving the information bits of the information bit-vector for generating the codeword at a constant rate. Some examples of the method, apparatus, and non-transitory computer-readable medium described above may further include processes, features, means, or instructions for receiving the information bits of the information bit-vector for generating the codeword at a variable rate.

In some examples of the method, apparatus, and non-transitory computer-readable medium described above, generating at least one of a plurality of subsets of output bits using one of a plurality of encoding branch subsets comprises: inputting at least one frozen bit into the one of the plurality of encoding branch subsets.

In some cases, each of the subsets of output bits, including the first and second subsets, have a same number of bits. In some cases, the first subset of output bits has a different number of bits than the second subset of output bits.

Some examples of the method, apparatus, and non-transitory computer-readable medium described above may further include processes, features, means, or instructions for determining a code rate for the encoding by selecting a number of frozen bits for input to the plurality of encoding branches.

Some examples of the method, apparatus, and non-transitory computer-readable medium described above may further include processes, features, means, or instructions for performing bit-reversal on input indices of the plurality of encoding branches relative to corresponding output indices of the plurality of encoding branches prior to the dividing of the plurality of encoding branches.

In some examples of the method, apparatus, and non-transitory computer-readable medium described above, each of the plurality of subsets of output bits may have a same number of bits.

In some examples of the method, apparatus, and non-transitory computer-readable medium described above, the first of the plurality of subsets of output bits may have a different number of bits than the second of the plurality of subsets of output bits.

In some examples of the method, apparatus, and non-transitory computer-readable medium described above, a first subset of the bit-reversed indices correspond to the first encoding branch subset and a second subset of the bit-reversed indices correspond to the second encoding branch subset, and wherein each bit-reversed index in the first subset of the bit-reversed indices may have a higher number than each bit-reversed index in the second subset of the bit-reversed indices.

In some examples of the method, apparatus, and non-transitory computer-readable medium described above, the first subset of output bits correspond to a first subset of the output indices of the plurality of encoding branches and the second subset of output bits correspond to a second subset of the output indices of the plurality of encoding branches, and wherein the first subset of the output indices and the second subset of the output indices may be interleaved with each other.

In some examples of the method, apparatus, and non-transitory computer-readable medium described above, the second subset of output bits may be dependent on the first subset of output bits and bits input to the second encoding branch subset. In some examples of the method, apparatus, and non-transitory computer-readable medium described above, the first subset of output bits may be transmitted prior to transmission of the second subset of output bits.

In some examples of the method, apparatus, and non-transitory computer-readable medium described above, the encoder may be a linear block encoder. In some examples of the method, apparatus, and non-transitory computer-readable medium described above, the linear block encoder may be a polar code encoder, a Reed-Muller (RM) encoder, a polar RM encoder, a systematic encoder, or a bit-reversed encoder.

In some examples of the method, apparatus, and non-transitory computer-readable medium described above, generating the first and second subsets of output bits of the codeword in first and second encoding operations comprises: inputting a first subset of the information bits of the information bit-vector and a first error detecting code generated from the first subset of the information bits to encoding branches of the first encoding branch subset for generating the first subset of output bits. Some examples of the method, apparatus, and non-transitory computer-readable medium described above may further include processes, features, means, or instructions for inputting a second subset of the information bits of the information bit-vector and a second error detecting code generated from the first subset of the information bits, the second subset of the information bits, or both the first and second subsets of the information bits, to encoding branches of the second encoding branch subset for generating the second subset of output bits.

BRIEF DESCRIPTION OF THE DRAWING

FIG. 8 illustrates an example of a table that supports outputting of codeword bits for transmission prior to loading all input bits in accordance with one or more aspects of the present disclosure.

FIG. 11 illustrates an example of a table that supports outputting of codeword bits for transmission prior to loading all input bits in accordance with one or more aspects of the present disclosure.

DETAILED DESCRIPTION

Techniques are described for outputting codeword bits for transmission prior to loading all input bits. An encoder may include multiple encoding branches that are each loaded with a bit to be encoded. The encoding branches may have different levels of dependency, where the encoding branch dependency may be associated with a number of encoding branches on which the codeword bit associated with the encoding branch depends. Conventional encoding techniques result in undesirable encoder latency as such techniques do not consider dependencies between encoding branches and delay outputting bits of a codeword until a most dependent bit of the codeword is calculated. The most dependent bit of the codeword may be the bit that depends on the highest number of other encoding branches in a set of encoding branches. The encoder examples described herein decrease encoder latency by dividing encoding branches into at least two subsets based at least in part on inter-branch dependencies. The encoder may process encoding branches subset by subset in order of increasing inter-branch dependency. An encoder may first encode bits using an encoding branch subset that is independent of other encoding branches and output those encoded bits for transmission prior to outputting bits encoded by branches that depend on other encoding branches. By encoding and outputting encoded bits in such a manner, the encoder as described herein may have less latency as compared to conventional encoders that do not consider branch inter-dependency. The encoder may also output codeword bits in sets that provide for simplified memory access by a decoder.

Aspects of the disclosure are initially described in the context of a wireless communications system. Devices of the wireless communications system, such as user equipment and base stations, may decrease encoder latency by utilizing encoders that output codeword bits for transmission prior to loading all input bits. Aspects of the disclosure are further illustrated by and described with reference to apparatus diagrams, system diagrams, and flowcharts that relate to outputting of codeword bits for transmission prior to loading all input bits.

Figure 1:
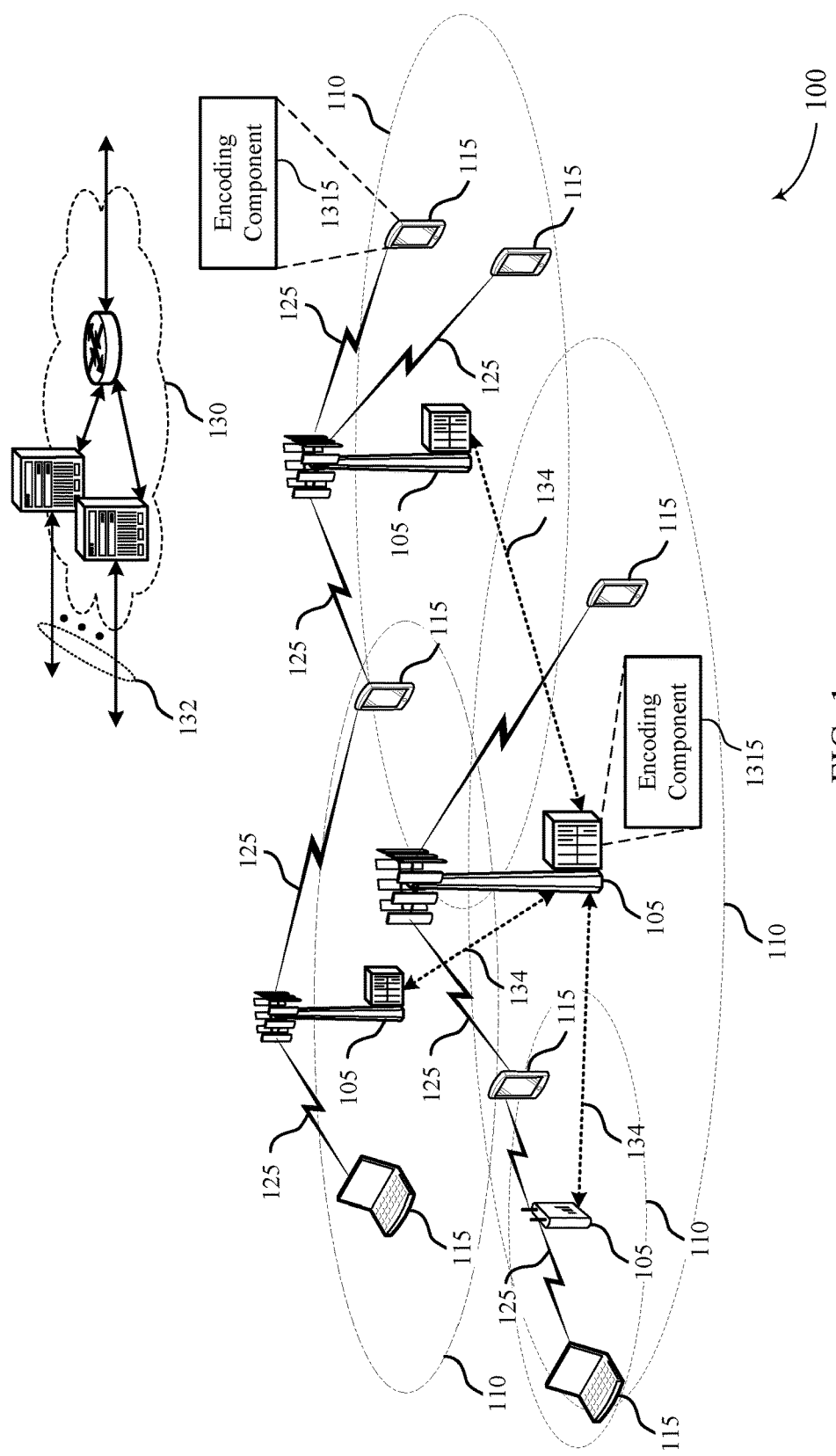
FIG. 1 illustrates an example of a system for wireless communication that supports outputting of codeword bits for transmission prior to loading all input bits in accordance with one or more aspects of the present disclosure.

FIG. 1 illustrates an example of a wireless communications system 100 in accordance with one or more aspects of the present disclosure. The wireless communications system 100 includes base stations 105, UEs 115, and a core network 130. In some examples, the wireless communications system 100 may be an LTE, LTE-Advanced, new radio (NR), or 5G network. In NR or 5G networks, the base stations 105 may include access nodes (ANs), central units (CUs), and/or distributed units (DUs). An AN may be an example of a new radio base station (NR BS), a new radio Node-B (NR NB), a network node (NN), or the like. A CU may be an example of a central node (CN), an access node controller (ANC), or the like. Each of the DUs may be an example of an edge node (EN), an edge unit (EU), a radio head (RH), a smart radio head (SRH), a transmission and reception point (TRP), or the like. The UEs 115, base stations 105, and other devices of wireless communications system 100 may have low-latency encoders that output codeword bits for transmission prior to loading all input bits. A UE 115, a base station 105, or both, may include, an encoding component 1315 as described below in further detail.

Base stations 105 may wirelessly communicate with UEs 115 via one or more base station antennas. Each base station 105 may provide communication coverage for a respective geographic coverage area 110. Communication links 125 shown in wireless communications system 100 may include uplink (UL) transmissions from a UE 115 to a base station 105, or downlink (DL) transmissions, from a base station 105 to a UE 115. UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of things (IoT) device, an Internet of Everything (IoE) device, a machine type communication (MTC) device, an appliance, an automobile, or the like.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as eNodeBs (eNBs) 105. Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include CDMA systems, TDMA systems, FDMA systems, and OFDMA systems. A wireless multiple-access communications system may include a number of base stations, each simultaneously supporting communication for one or more multiple communication devices, which may be otherwise known as a UE.

In some cases, a base station 105 and a user equipment (UE) 115 may communicate using carrier frequencies at 6 GHz or less (sub-6), or higher such as 28 GHz, 60 GHz, etc. which is also known as millimeter wave communications. Each component can have a bandwidth of, e.g., 1.4, 3, 5, 10, 15, 20 MHz, etc. In some cases, a base station 105 and a UE 115 may communicate using more than one carrier in a carrier aggregation (CA) configuration. Each aggregated carrier is referred to as a component carrier (CC). In some cases, the number of CCs can be limited to, e.g., a maximum of five 20 MHz carriers, giving maximum aggregated bandwidth of 100 MHz. In frequency division duplexing (FDD), the number of aggregated carriers can be different in downlink (DL) and uplink (UL). The number of UL component carriers may be equal to or lower than the number of DL component carriers. The individual component carriers can also be of different bandwidths. For time division duplexing (TDD), the number of CCs as well as the bandwidths of each CC will normally be the same for DL and UL. Component carriers may be arranged in a number of ways. For example, a carrier aggregation (CA) configuration may be based at least in part on contiguous component carriers within the same operating frequency band, i.e., called intra-band contiguous CA. Non-contiguous allocations can also be used, where the component carriers may be either be intra-band, or inter-band.

Within a CA configuration, certain CCs may be configured differently from other CCs of the CA configuration. For example, the CA configuration may include a primary CC (PCC or PCell) and one or several secondary CCs (SCC or SCell). The PCell may be configured to carry uplink and downlink control information on PUCCH and PDCCH/ePDCCH, respectively. PDCCH on a PCell may include scheduling information for resources of the PCell or for resources of one or more SCells, or both. An SCell may include PDCCH, which may include scheduling information for resources of that SCell or for one or more other SCells. Some SCells may be configured for downlink communications and may not be configured for uplink communications, while a PCell may be configured for both uplink and downlink communications. Various carriers of the CA may be TDD or FDD configured. A CA configuration may include both TDD and FDD configured carriers.

In some cases, wireless communications system 100 may utilize enhanced component carriers (eCCs). In some examples, NR or 5G networks may utilize eCCs, and the use of eCCs over a shared spectrum may be referred to as New Radio for Shared Spectrum (NR-SS). An SCell may, for instance, be an eCC. An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power). In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

In some environments, reducing or minimizing system latency may be an important system performance factor. However, an encoder may have a finite input bus width or input bits of a single input vector may become available at different times. For example, an input vector may include information bits and check bits, where some or all information bits may be generated by or received from different sources. In addition, the check bits may not be available until sometime after all of the information bits are available. The input vector may be, for example, a physical channel message (e.g., control channel message) or a data packet. Additionally or alternatively, a codeword corresponding to a single input vector may not be transmitted in a single transmission time interval (e.g., one symbol period, multiple symbol periods, etc.). For example, transmissions associated with a physical channel message or packet may span multiple transmission time intervals.

System performance of transmission of information bits in low-latency environments may be determined by factors such as overhead, coding gain, transmission pipelining, and decoding delay. Some processing techniques may emphasize improving transmission pipelining and decoding delay at the expense of higher overhead and lower coding gain. Generally, use of a larger code length (e.g., larger codeword) reduces overhead and provides higher coding gain. However, a larger code length may result in a larger decoding delay and overall system latency. In contrast, smaller code length reduces latency or decoding delay but results in an increase in overhead and lower coding gain.

Components of the wireless communications system 100 including the base stations 105 or UEs 115 may implement encoding techniques that output codeword bits for transmission prior to loading all input bits. A base station 105 or a UE 115 may include an encoder having multiple encoding branches that are each loaded with a bit to be encoded. The encoder examples described herein may decrease encoder latency by dividing encoding branches into subsets based at least in part on inter-branch dependencies. The encoder may process encoding branches subset by subset in order of increasing inter-branch dependency. In an example, the encoder may first encode bits using an encoding branch subset that is independent of other encoding branches and output those encoded bits for transmission prior to outputting bits encoded by branches that depend on other encoding branches. By encoding and outputting encoded bits in such a manner, an encoder as described herein may have less latency as compared to conventional encoders that do not consider branch inter-dependency.

Figure 2:
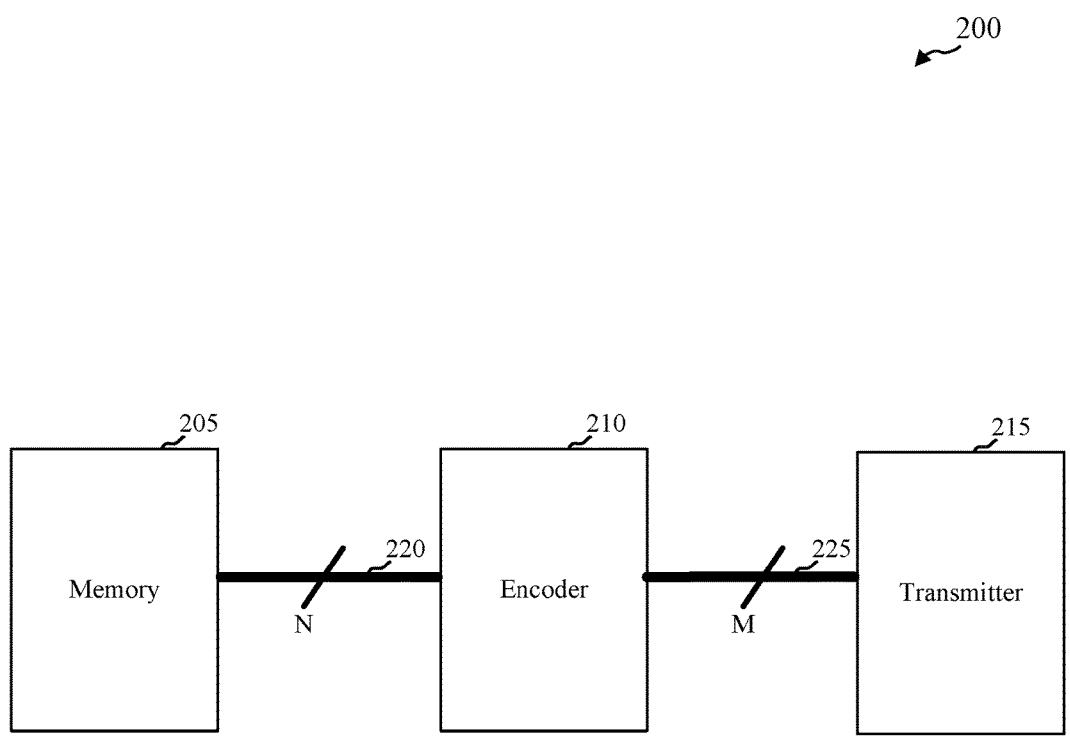
FIG. 2 illustrates an example of a device that supports outputting of codeword bits for transmission prior to loading all input bits in accordance with one or more aspects of the present disclosure.

FIG. 2 illustrates an example of a device 200 for outputting of codeword bits for transmission prior to loading all input bits in accordance with one or more aspects of the present disclosure. The device 200 may be any device within wireless communications system 100 that performs an encoding algorithm. The device 200 may be, for example, a UE 115 or base station 105 as described in FIG. 1. The following refers to device 200 as a UE 115.

In many instances, a UE 200 may have data stored in memory 205 to be transmitted to another device, such as base station 105. To initiate the transmission process, the UE 200 may retrieve from memory 205 the data for transmission, encode the data by an encoder 210, and transmit the encoded data by a transmitter 215. In one example, a bus 220 may connect the memory 205 and encoder 210, and a bus 225 may connect encoder 210 and transmitter 215. Bus 220 may provide N bits at a time to encoder 210, and bus 225 may provide M bits at a time to transmitter 215. N and M may be positive integers, may be the same number, or may be different numbers. Encoder 210 may use a number of encoding techniques to encode the data for transmission. For example, error correcting codes may be used to introduce redundancy in a code block so that transmission errors may be detected and corrected. Example encoding techniques include linear block encoding, polar encoding, Reed-Muller encoding, polar RM encoding, and the like. The following initially describes an example of encoder 210 being a polar encoder with 8 encoding branches, and later extends the principles herein to an encoder having any number of encoding branches.

Figure 3:
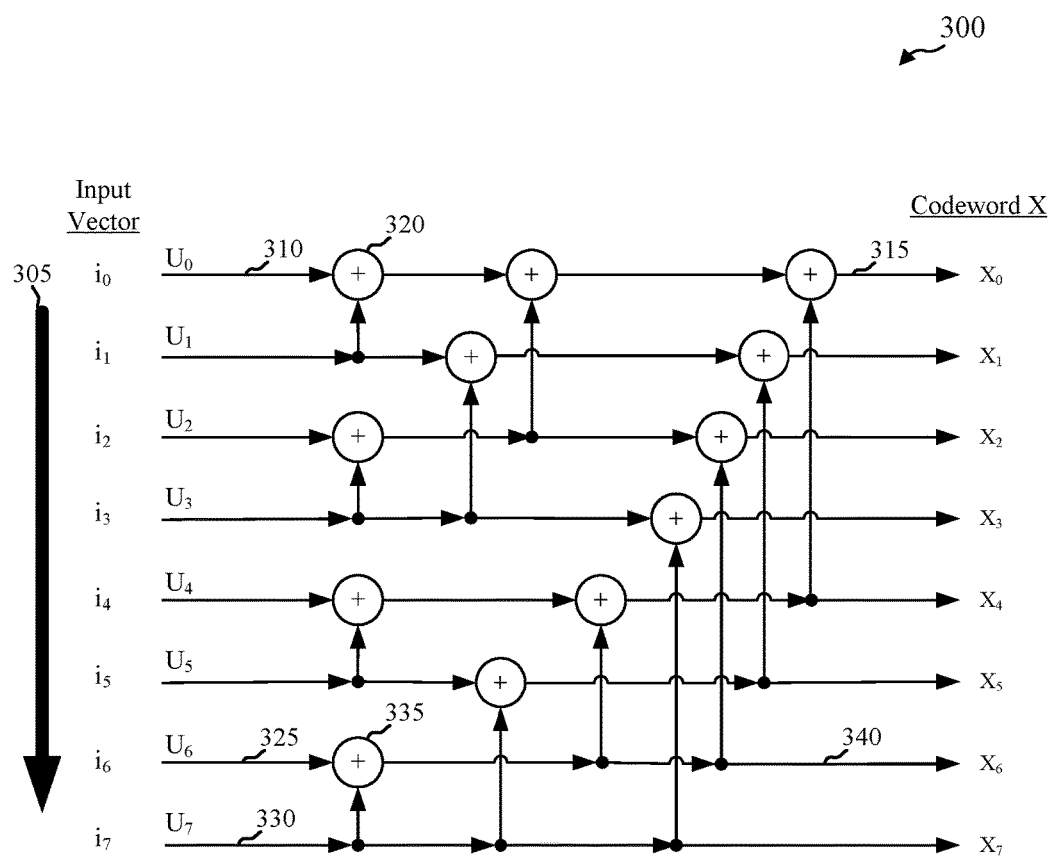
FIG. 3 illustrates an example of a polar encoder in accordance with one or more aspects of the present disclosure.

FIG. 3 illustrates an example of an encoder 300 in accordance with one or more aspects of the present disclosure. Encoder 300 is an example of encoder 210 of FIG. 2. The following describes encoder 300 as being a polar encoder, and the principles described herein may be extended to other types of linear block encoders such as, for example, a Reed-Muller (RM) encoder, a polar RM encoder, a systematic encoder, a bit-reversed encoder, and the like.

In an example, polar encoder 300 may encode an input vector of N bits to generate a codeword X of the same number of bits. The depicted polar encoder 300 is an 8-bit encoder, and thus encodes an 8-bit input vector $I=[i_0, i_1, \ldots, i_7]$ and generates an 8-bit codeword $X=[x_0, x_1, \ldots, x_7]$. Polar encoders of other bit-sizes may also be used. Generally, the length N of a polar encoder may follow the relationship that $\log 2(N)$ is an integer. Polar encoder 300 includes multiple encoding branches $U_0$ to $U_7$, where each encoding branch may be loaded with a corresponding bit from the input vector, perform one or more encoding operations on the input bit based on one or more other input bits, and output a bit x of codeword X. In branch $U_0$, for example, bit $i_0$ is received at input 310, three Boolean exclusive or (XOR) operations are performed (see "+" symbol at element 320), and bit $x_0$ of codeword X is output at output 315.

As depicted, each encoding branch $U_0$ to $U_7$ of polar encoder 300 may perform zero or more encoding operations on the input bits. Each encoding operation may be a parity check operation (e.g., XOR) or a repetition operation (repetition of a bit for use in a parity check operation for a different branch). Encoding a bit in one encoding branch may depend on bits input to one or more other encoding branches. For example, branch $U_6$ performs a parity check operation by XOR'ing bits $i_6$ and $i_7$ (e.g., $x_6=i_6$ XOR $i_7$). As seen, bit $i_6$ is loaded at input 325 of encoding branch $U_6$ and bit $i_7$ is loaded at input 330 of branch $U_7$. At 335, encoding branch $U_6$ XORs $i_6$ and $i_7$ and provides $x_6$ at output 340. The remaining encoding branches $U_0$ to $U_7$ perform similar operations to encode corresponding bits of the input vector. In conventional techniques, bits of the input vector are loaded to encoding branches $U_0$ to $U_7$ from top to bottom, represented by arrow 305. Thus, input $i_0$ is first loaded into encoding branch $U_0$, input $i_1$ is next loaded into encoding branch $U_1$, and so forth. The resulting codeword X is similarly output from polar encoder 300 to a transmitter (e.g., transmitter 215 of FIG. 2) for transmission in top to bottom order. Thus, codeword bit $x_0$ is transmitted first, codeword bit $x_1$ is transmitted next, and so forth. Loading bits of input vector and outputting bits of codeword X from top to bottom results in undue encoding latency.

Figure 4:
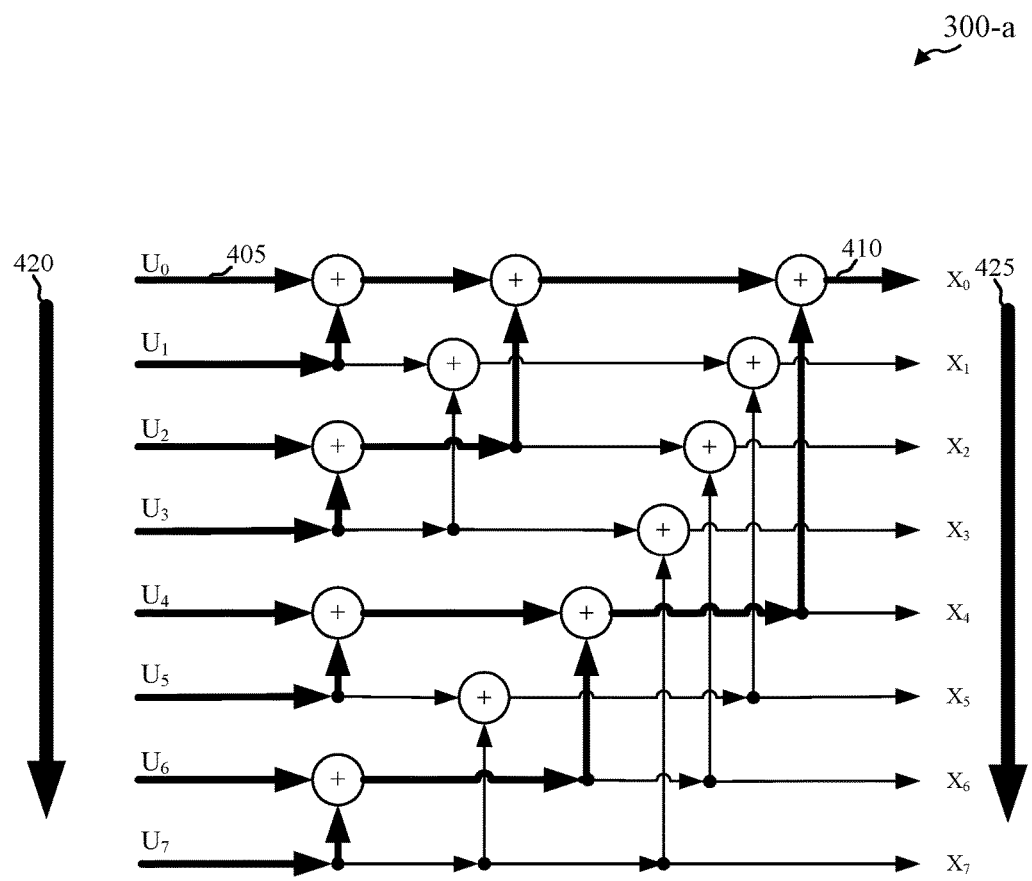
FIG. 4 illustrates an example of a polar encoder in accordance with one or more aspects of the present disclosure.

FIG. 4 illustrates an example of an encoder 400 in accordance with one or more aspects of the present disclosure. This figure illustrates how conventional techniques of loading and outputting from a polar encoder cause encoding latency. Polar encoder 300-a is an example of polar encoder 210, 300 of FIGS. 2-3. Certain lines of the polar encoder 300-a have been darkened to show inter-branch dependency. The encoding branch dependency for each of the codeword bits $x_0$ to $x_7$ is associated with a number of encoding branches (e.g., U-bits) on which the codeword bit associated with the encoding branch depends. The most dependent bit of the codeword depends on the highest number of other encoding branches in the polar encoder 300-a. As illustrated, codeword bit $x_0$ depends on bits input to all of the encoding branches $U_0$ to $U_7$. Thus, codeword bit $x_0$ is the most dependent as its output depends on all of the other encoding branches. While not darkened, it can be seen that codeword bit $x_1$ depends on bits input to encoding branches $U_1$ and $U_3$ to $U_7$, codeword bit $x_2$ depends on bits input to encoding branches $U_2$, $U_3$, $U_6$ and $U_7$, and so forth. Thus, from top to bottom, a bit input to a particular encoding branch of polar encoder 300-a generally depends on bits encoded by one or more higher-indexed encoding branches, but is generally independent of bit(s) input to any lower-indexed encoding branch.

Conventional techniques load bits into the polar encoder 300-a from top to bottom (see arrow 420), and similarly output codeword bits x from top to bottom (see arrow 425). Loading and outputting encoded bits from top to bottom results in excessive encoder latency because transmission cannot begin until the codeword bit $x_0$, having the highest inter-branch dependency, is ready for transmission. Moreover, polar encoders 300 and 300-a cannot generate codeword X until all inputs are available at each encoding branch U. The examples described herein reduce encoder latency by changing the order in which bits are loaded into and outputted from a polar encoder.

Figure 5:
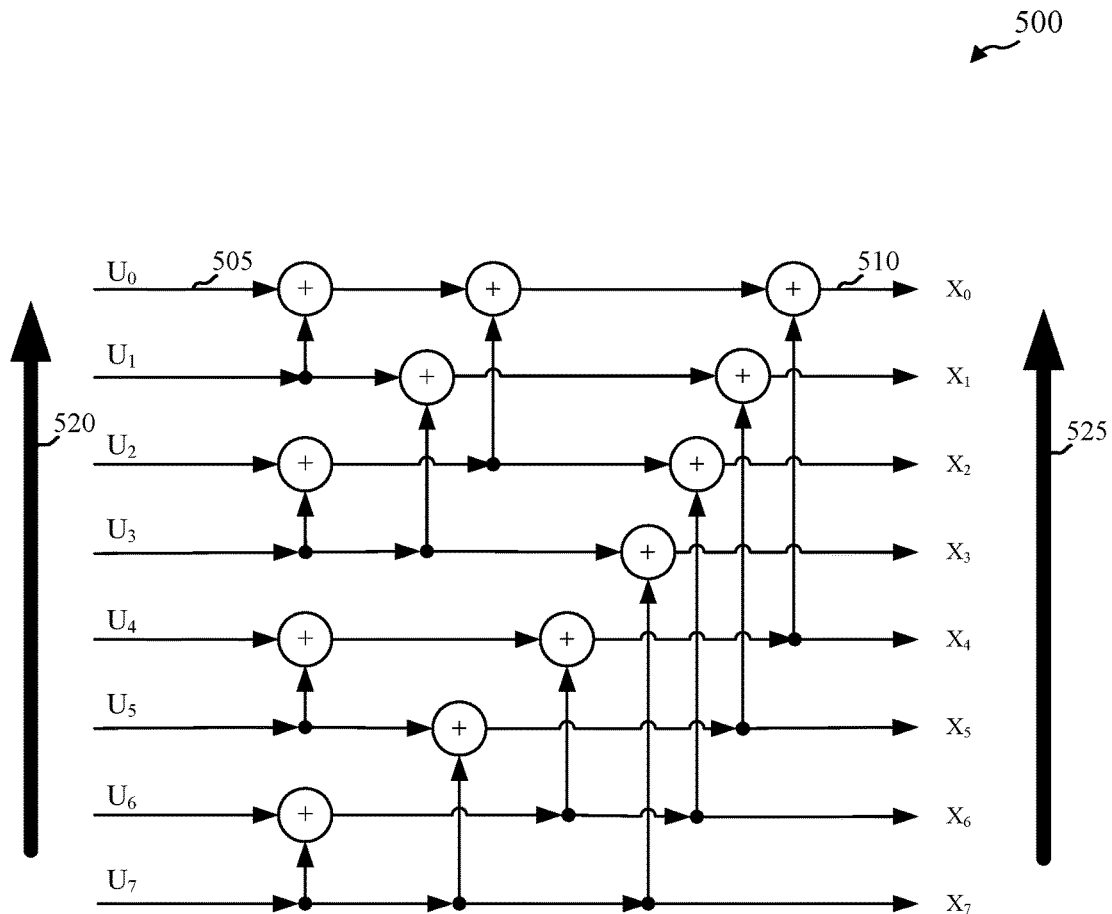
FIG. 5 illustrates an example of a polar encoder that supports outputting of codeword bits for transmission prior to loading all input bits in accordance with one or more aspects of the present disclosure.

FIG. 5 illustrates an example of a polar encoder 500 for outputting of codeword bits for transmission prior to loading all input bits in accordance with one or more aspects of the present disclosure. Polar encoder 500 is an example of polar encoder 210, 300, 300-a of FIGS. 2-4. To reduce encoder latency, polar encoder 500 reverses the order in which bits of an input vector are loaded and codeword bits are output. By doing so, the polar encoder 500 can output at least some codeword bits of codeword X to transmitter 215 for transmission prior to loading all bits of input vector and prior to generating an entire codeword X. In some instances, the polar encoder 500 can output codeword bits for transmission by transmitter 215 prior to when all bits of input vector are available. In some examples, the input vector includes information bits of an information bit-vector I, frozen bits, and/or parity bits, and thus the frozen bits may be known while the information bits and parity bits (if present) may not be available all at the same time. In other examples, encoding branches corresponding to the frozen bits may be hardcoded, and, in some examples, the input vector may be the information bit-vector I and/or parity bits. An information bit-vector may also be referred to as an information block.

In an example, polar encoder 500 may determine which codeword bits have the fewest dependencies on other encoding branches, and load bits into encoding branches for encoding based at least in part on the inter-branch dependency. Arrow 520 reflects the generally bottom to top order in which bits of an input vector are loaded into polar encoder 500, and arrow 525 reflects the generally bottom to top order in which bits of a codeword are output for transmission.

Below is a generalized algorithm for loading, encoding, and outputting using polar encoder 500 of an N-bit codeword length, where N is a positive integer.

1. Place a first subset of bits from the input vector in a first subset of encoding branches $[u_j \rightarrow u_{N-1}]$ having the fewest dependencies.
2. Calculate and output for transmission codeword bits $[x_j \rightarrow x_{N-1}]$ from the first subset of encoding branches.
3. Place a second subset of bits from the input vector in a second subset of encoding branches $[u_i \rightarrow u_{j-1}]$ having the next fewest dependencies.
4. Calculate and output for transmission codeword bits $[x_i \rightarrow x_{j-1}]$ from the second subset of encoding branches.

The algorithm may continue loading subsets of bits from the input vector into subsequent subsets of encoding branches having increasing amounts of inter-branch dependences until all bits of the input vector have been encoded and output. Thus, the encoder 500 may output one or more subsets of the codeword bits to a transmitter (e.g., transmitter 215) prior to encoder 500 generating the entire codeword X. In some cases, encoder 500 may output one or more subsets of the codeword bits to the transmitter prior to receiving all bits of the input vector. Transmitter 215 may begin and/or complete transmitting the one or more codeword bits before a final subset of the codeword bits has been output by the polar encoder 500.

Figure 6:
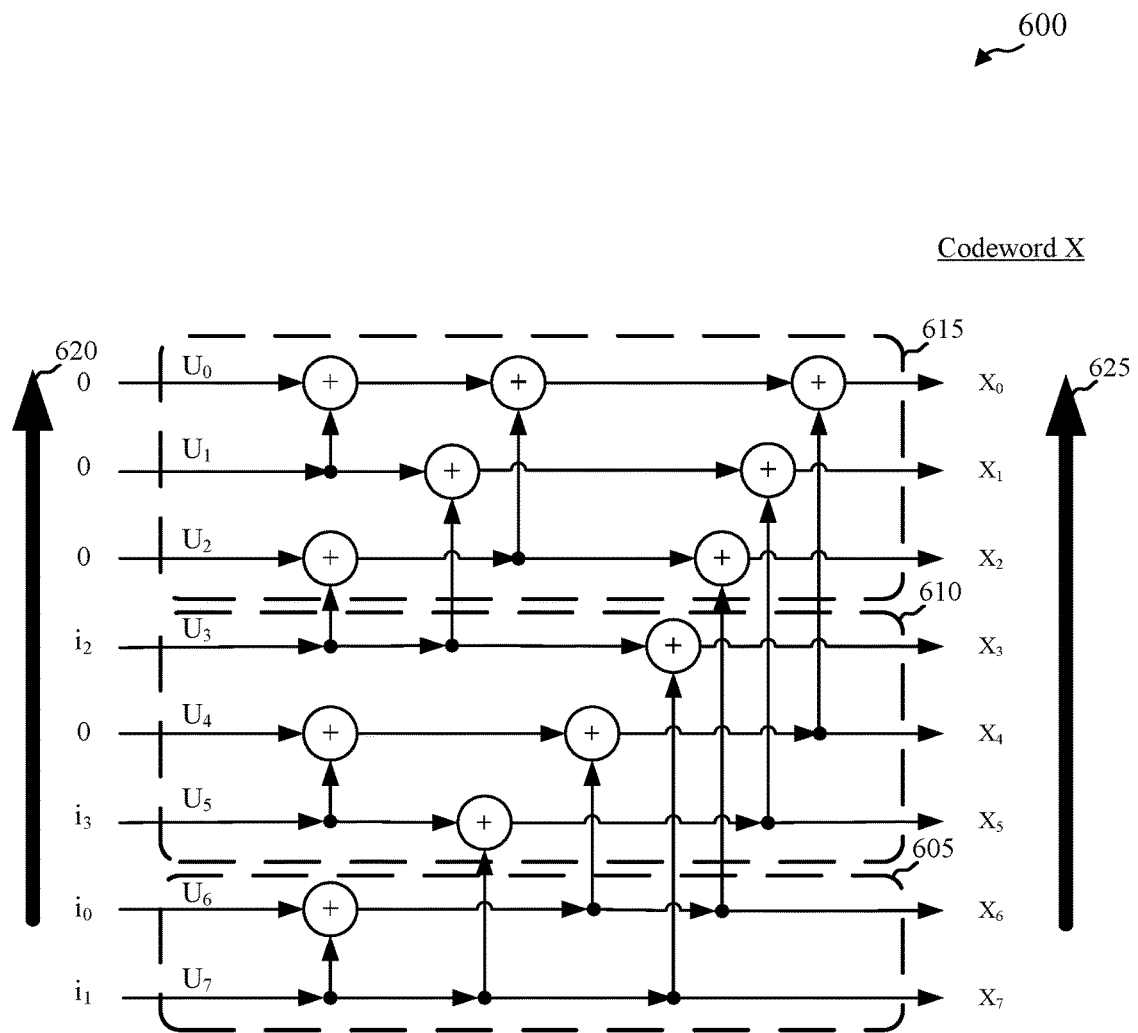
FIG. 6 illustrates an example of a constant input rate polar encoder that supports outputting of codeword bits for transmission prior to loading all input bits in accordance with one or more aspects of the present disclosure.
Figure 7:
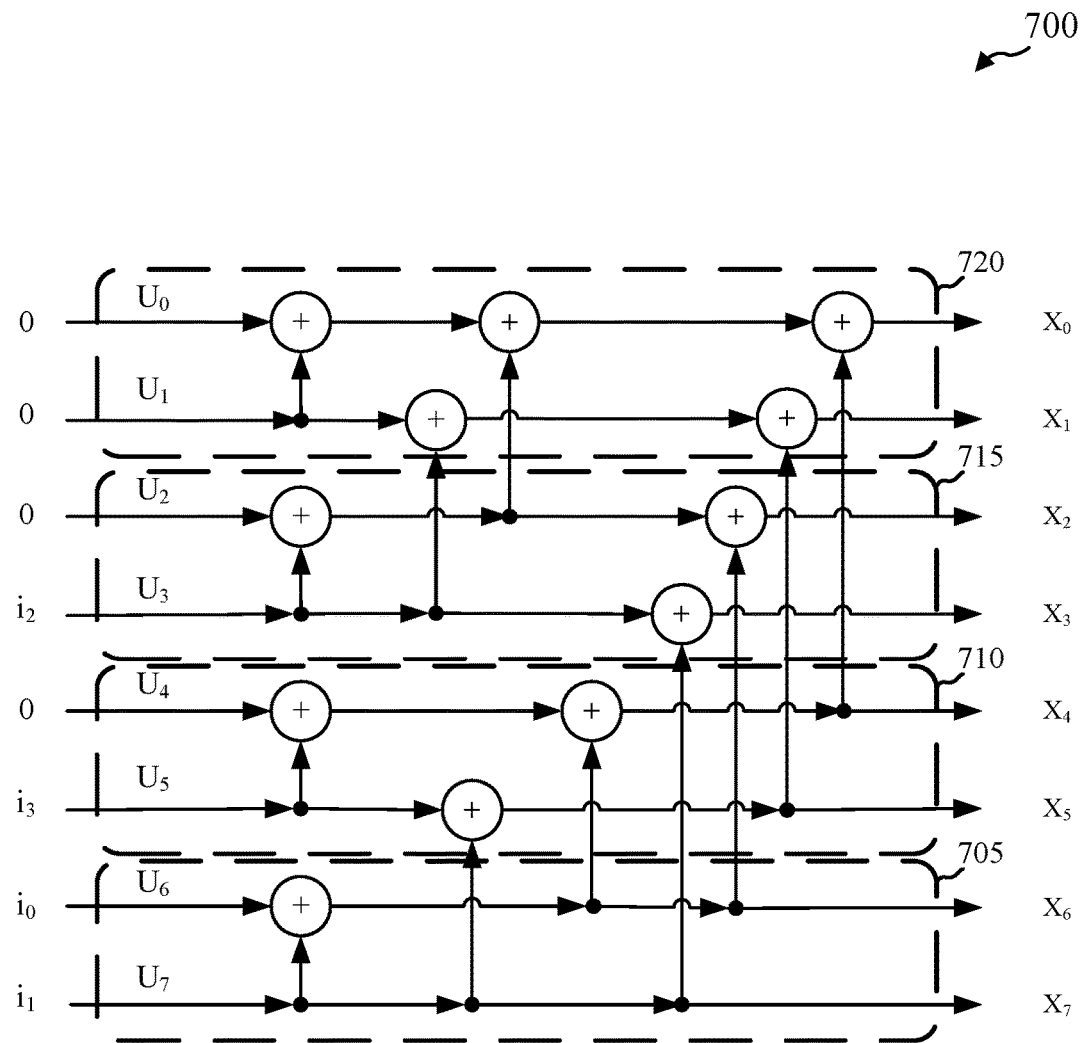
FIG. 7 illustrates an example of a constant output rate polar encoder that supports outputting of codeword bits for transmission prior to loading all input bits in accordance with one or more aspects of the present disclosure.

Below in FIGS. 6-7 are two examples of this generalized algorithm for an 8-bit polar encoder. FIG. 6 describes a polar encoder that receives information bits of an information bit-vector at a constant rate and outputs bits at a variable rate, and FIG. 7 describes a polar encoder that receives information bits of an information bit-vector at a variable rate and outputs codeword bits at a constant rate.

FIG. 6 illustrates an example of a constant input rate polar encoder 600 for outputting of codeword bits for transmission prior to loading all input bits in accordance with one or more aspects of the present disclosure. Polar encoder 600 is an example of polar encoder 210, 300, 300-*a*, 500 of FIGS. 2-5.

Polar encoder 600 generally loads bits for encoding from bottom to top (see arrow 620) and also generally outputs codeword bits from bottom to top (see arrow 625). To do so, polar encoder 600 divides encoding branches into three subsets based at least in part on inter-branch encoding dependencies. The first encoding branch subset 605 has the fewest dependencies as encoding its input bits is independent of the bits for loading on any other encoding branch subset. The second encoding branch subset 610 has the next fewest dependencies as encoding its input bits only depends on the input bits themselves and the input bits to the first encoding branch subset 605. The third encoding branch subset 615 has the most dependencies as encoding its input bits depends on the input bits themselves and both the input bits to the first and second encoding branch subsets. As can be seen, outputs for each respective encoding branch subset are independent of inputs to encoding branches of encoding branch subsets having a higher order. In an example, encoding branch subset 605 is independent of inputs to higher order subsets 610, 615, and encoding branch subset 610 is independent of inputs to higher order subset 615.

In the depicted example, the input vector may include frozen bits and information bits of an information bit-vector. Frozen bits may be set to a defined value and may be used to define a transmission rate. For example, encoder 600 may determine which of the encoding branches receive the frozen bits for a given rate. Based at least in part on which encoding branches are loaded with the frozen bits, a decoder may be able to determine the transmission rate. For a polar encoder having N encoding branches, K information bits may be respectively input into K of the N branches and N-K frozen bits may be respectively input to K-N of the N branches, where K and N are integers and K is less than N. In the depicted example, frozen bits are set to 0 and input to encoding branches $U_0$, $U_1$, $U_2$, $U_4$. In other examples, a frozen bit may be set to a different value (e.g., 1), and frozen bits may be input to a different combination of encoding branches (e.g., for a different transmission rate). In some examples, frozen bits may be included in input vector. In other examples, the input vector may be an information bit-vector that includes information bits, but does not include any frozen bits. In some examples, the input vector is received and information bits of the information bit-vector are mapped to the locations of encoding branches U designated for information bits while frozen bits are mapped to the remaining encoding branches U.

Information bits carry information to be encoded. In the depicted example, information bits $i_0$, $i_1$, $i_2$, and $i_3$ are input to encoding branches $U_3$, $U_5$, $U_6$, $U_7$. Below is a description of an encoding algorithm applied by polar encoder 600 that receives information bits of an information bit-vector at a constant rate for encoding. In this example, information bits of an information bit-vector $I=[i_0, i_1, i_2,$ and $i_3]$ may be made available to the encoder at a rate of two (2) bits of each of multiple time intervals. That is, $i_0$ and $i_1$ may be available (e.g., generated by a prior processing block) prior information bits $i_2$ and $i_3$ being made available.

In a first encoding operation, polar encoder 600 loads a first subset of bits of the input vector into the first encoding branch subset 605. In particular, bit $i_0$ of information bit-vector I is loaded into branch $U_6$ and bit $i_1$ of information bit-vector I is loaded into branch $U_7$.

In a second encoding operation, the polar encoder 600 calculates and outputs codeword bits from the first encoding branch subset 605. In particular, encoding branch $U_6$ outputs codeword bit $x_6$ and encoding branch $U_7$ outputs codeword bit $x_7$. In a third encoding operation, the polar encoder 600 loads a second subset of bits of the input vector into the second encoding branch subset 610. For example, bit $i_2$ of information bit-vector I is loaded into branch $U_3$, a frozen bit is loaded into branch $U_4$, and bit $i_3$ of information bit-vector I is loaded into branch $U_5$. Polar encoder 600 may thus output codeword bits $x_6$ and $x_7$ for transmission by a transmitter 215 prior to outputting other bits (e.g., $x_5$, $x_4$, and $x_3$) of codeword X. Polar encoder 600 can do so because codeword bits $x_6$ and $x_7$ are independent of inputs to encoding branches of encoding branch subsets 610, 615 that have a higher order. In some cases, the second and third encoding operations may be done concurrently (e.g., in a pipelined encoder where registers may capture the inputs/outputs of the encoder).

In a fourth encoding operation, polar encoder 600 calculates and outputs codeword bits from the second encoding branch subset 610. In particular, branch $U_3$ outputs codeword bit $x_3$, branch $U_4$ outputs codeword bit $x_4$, branch $U_5$ outputs codeword bit $x_5$. In a fifth encoding operation, polar encoder 600 loads a third subset of bits of the input vector into the third encoding branch subset 615. In this case, the information bit-vector I does not have any further information bits and frozen bits are loaded into branches $U_0$, $U_1$, and $U_2$. Polar encoder 600 may output codeword bit $x_3$, $x_4$ and $x_5$ for transmission by a transmitter 215 prior to outputting $x_0$, $x_1$ and $x_2$ of codeword X. Again, polar encoder 600 can do so because codeword bits $x_3$, $x_4$ and $x_5$ only depend on bits loaded onto encoding branch subsets 605 and 610, and are independent of inputs to encoding branches of encoding branch subset 615 that has a higher order. In some cases (e.g., piplelining), the fourth and fifth encoding operations are performed concurrently.

In a sixth encoding operation, the polar encoder 600 calculates and outputs codeword bits from the third encoding branch subset 615. In particular, branch $U_0$ outputs codeword bit $x_0$, branch $U_1$ outputs codeword bit $x_1$, branch $U_2$ outputs codeword bit $x_2$. Polar encoder 600 may output codeword bits $x_0$, $x_1$ and $x_2$.

The polar encoder 600 may thus be considered as having a constant input rate as two information bits from information bit-vector I may be received at a time during a particular operation in the encoding algorithm. The polar encoder 600 may be considered as having a variable output rate as two or three codeword bits may be output per operation. An operation as described herein designates an order in which operations are performed. An operation of an encoding algorithm may correspond to a particular cycle or set of cycles of a computer processor. In other examples, multiple operations of the encoding algorithm may be completed within a single cycle. As may be seen, the polar encoder 600 may output bits of codeword X at least at the same time as, and in some instances prior to, receiving a last of the subsets of the information bits from the information bit-vector. For example, if input vector includes frozen and information bits of an information bit-vector I, the polar encoder 600 encodes and outputs the information bits $i_0$ and $i_1$ prior to frozen bits being loaded into branches $U_0$, $U_1$, and $U_2$.

By loading polar encoder 600 in such a manner, the polar encoder 600 may output a subset of bits from codeword X for transmission prior to loading all information bits of an input vector and prior to generating the entire codeword X. Thus, the encoder 600 may output the subset of codeword bits to a transmitter for transmitting the subset of codeword bits earlier than conventional techniques. For example, transmitter 215 may begin and/or complete transmitting a subset of one or more codeword bits before another subset of one or more codeword bits has been output by the polar encoder 600. For example, transmitter 215 may transmit codeword bits $x_6$ and $x_7$ in a first symbol period, codeword bits $x_3$, $x_4$, and $x_5$ in a second symbol period, and codeword bits $x_0$, $x_1$, and $x_2$ in a third symbol period, where codeword bits $x_0$, $x_1$, and $x_2$ are not output by the encoder until at least after the first symbol period.

A polar encoder may configured to output bits at a constant rate. FIG. 7 illustrates an example of a constant output rate polar encoder 700 for outputting of codeword bits for transmission prior to loading all input bits in accordance with one or more aspects of the present disclosure. Polar encoder 700 is an example of polar encoder 210, 300, 300-*a*, 500, 600 of FIGS. 2-6.

Similar to the description provided above in FIG. 6, the information bit-vector I only includes the information bits (e.g., I=[$i_0$, $i_1$, $i_2$, and $i_3$]) to be encoded and does not include any frozen bits. In the depicted example, polar encoder 700 divides the encoding branches into four subsets based at least in part on encoding branch inter-dependencies. The first encoding branch subset 705 has the fewest inter-branch dependencies as encoding its input bits is independent of any other encoding branch subsets. The second encoding branch subset 710 has the next fewest inter-branch dependencies as encoding its input bits only depends on its input bits and the input bits to the first encoding branch subset 705. The third encoding branch subset 715 has the next fewest inter-branch dependencies as encoding its input bits depends on its input bits and the inputs bits to both the first and second encoding branch subsets. The fourth encoding branch subset 720 has the most inter-branch dependencies as encoding its input bits depends on its input bits and the input bits to the first, second, and third encoding branch subsets.

As can be seen, outputs for each respective encoding branch subset are independent of inputs to encoding branches of encoding branch subsets having a higher order. In an example, encoding branch subset 705 is independent of inputs to higher order subsets 710, 715, 720, and encoding branch subset 710 is independent of inputs to higher order subsets 715, 720. Below is a description of an encoding algorithm applied by constant output rate polar encoder 700.

In a first encoding operation, the polar encoder 700 loads a first subset of bits of the input vector into the first encoding branch subset 705. In particular, bit $i_0$ of information bit-vector I is loaded into branch $U_6$ and bit $i_1$ of information bit-vector I is loaded into branch $U_7$.

In a second encoding operation, the polar encoder 700 calculates and outputs codeword bits from the first encoding branch subset 705. In particular, branch $U_6$ outputs codeword bit $x_6$, and branch $U_7$ outputs codeword bit $x_7$. In a third encoding operation, the polar encoder 700 loads a second subset of bits of the input vector into the second encoding branch subset 710. In particular, a frozen bit is loaded into branch $U_4$, and bit $i_3$ of information bit-vector I is loaded into branch $U_5$. In this example, polar encoder 700 may output codeword bits $x_6$ and $x_7$ prior to outputting other bits of codeword X. Polar encoder 700 can do so because codeword bits $x_6$ and $x_7$ do not depend on bits loaded to any of the other encoding branch subsets 710, 715, 720 having a higher order. In some cases, the second and third encoding operations may be done concurrently (e.g., in a pipelined encoder where registers may capture the inputs/outputs of the encoder).

In a fourth encoding operation, the polar encoder 700 calculates and outputs codeword bits from the second encoding branch subset 710. In particular, branch $U_4$ outputs codeword bit $x_4$ and branch $U_5$ outputs codeword bit $x_5$. In a fifth encoding option, the polar encoder 700 loads a third subset of bits of the input vector into the third encoding branch subset 715. In particular, a frozen bit is loaded into branch $U_2$, and information bit $i_2$ of information bit-vector I is loaded into branch $U_3$. In this example, polar encoder 700 may output codeword bit $x_4$ and $x_5$ prior to outputting bits $x_2$ and $x_3$ of codeword X. Polar encoder 700 can do so because codeword bits $x_4$ and $x_5$ only depend on bits loaded into the first and second encoding branch subsets 705 and 710, but do not depend on bits input to the third or fourth encoding branch subsets 715, 720 having a higher order. In some cases, the fourth and fifth encoding operations may be done concurrently (e.g., a pipelined encoder).

In a sixth encoding operation, the polar encoder 700 calculates and outputs codeword bits from the third encoding branch subset 715. In particular, branch $U_2$ outputs codeword bit $x_2$ and branch $U_3$ outputs codeword bit $x_3$. In a seventh encoding operation, the polar encoder 700 loads a fourth subset of bits of the input vector into the fourth encoding branch subset 720. In particular, frozen bits are loaded into branches $U_0$ and $U_1$. In this example, polar encoder 700 may output codeword bits $x_2$ and $x_3$ prior to outputting bits $x_0$ and $x_1$ of codeword X. Polar encoder 700 can do so because codeword bits $x_2$ and $x_3$ only depend on bits loaded into the first, second, and third encoding branch subsets, but do not depend on bits input to the fourth encoding branch subset 720 having a higher order. In some cases, the sixth and seventh encoding operations may be done concurrently (e.g., a pipelined encoder).

In an eighth encoding operation, the polar encoder 700 calculates and outputs codeword bits from the fourth encoding branch subset 720. In particular, branch $U_0$ outputs codeword bit $x_0$ and branch $U_1$ outputs codeword bit $x_1$.

The polar encoder 700 performing the above algorithm is considered to provide a constant output rate as encoder 700 outputs two bits at each operation of the algorithm. The polar encoder 700 may be considered as having a variable input rate as differing numbers of information bits of an information bit-vector I may be input per operation. An operation of this encoding algorithm may be defined similarly as an operation of polar encoder 600 as described above. By loading polar encoder 700 using this encoding algorithm, the polar encoder 700 may output a subset of bits from codeword X for transmission prior to loading all input bits of information bit-vector I and prior to generating the entire codeword X. Thus, a transmitter 215 may receive from the encoder 700 and begin transmitting the subset of codeword bits earlier than conventional techniques. For example, transmitter 215 may transmit codeword bits $x_6$ and $x_7$ in a first symbol period, codeword bits $x_4$ and $x_5$ in a second symbol period, codeword bits $x_3$ and $x_2$ in a third symbol period, and codeword bits $x_0$ and $x_1$ in a fourth symbol period, where codeword bits $x_0$ and $x_1$ are not output by the encoder until at least after the first symbol period.

The principles described herein may be extended to encoders having any number of encoding branches. Similar to the discussion of an 8-bit encoder described above, an n-bit encoder may output bits of a codeword for transmission prior to loading all input bits of an input vector and prior to generating the entire codeword. In such an example, n may be a positive integer. The following description provides an example of when bits can be output for transmission from a 128-bit encoder.

FIG. 8 illustrates an example of a table 800 for outputting of codeword bits for transmission prior to loading all input bits in accordance with one or more aspects of the present disclosure. Table 800 depicts the number of information bits required to transmit each corresponding block of 8 bits of data for a 128-bit codeword. A 128 branch polar encoder (e.g., $U_0$ to $U_{127}$) may be used to generate a 128-bit codeword X (e.g., $x_0$ to $x_{127}$). The table 800 indicates how many input information bits are required to output a particular 8-bit segment of the 128-bit code word, and table 800 may be read from left to right. The leftmost column of table 800 lists different code rates and the remaining columns list the number of input information bits required for a polar encoder to output a particular 8-bit segment of the 128-bit code word. For instance, the 128 branch polar encoder first calculates and outputs a first bit subset $[x_{120}, x_{127}]$ of codeword X, then calculates and outputs a second bit subset $[x_{112}, x_{119}]$ of codeword X bits, and so forth until a final bit subset $[x_0, x_7]$ of codeword X is calculated and output.

Referring to the row of table 800 for the ⅙ code rate, the 128 branch polar encoder can output a first 8-bit segment that includes bits $[x_{120}, x_{127}]$ of the 128-bit codeword as soon as the first 7 information bits are available and encoded by encoding branches $U_{120}$ to $U_{127}$. The 128 branch polar encoder can output a second 8-bit segment that includes bits $[x_{112}, x_{119}]$ of the 128-bit codeword as soon as 4 more additional information bits become available (e.g., a total of 11 information bits (7+4) have been received) and encoded by encoding branches $U_{112}$ to $U_{119}$. The remainder of this row, as well the other rows, may be read in the same manner. Similar to the description provided above, a polar encoder may divide its encoding branches into ordered subsets where each subset is independent of inputs to encoding branches of encoding branch subsets having a higher order, encode bits on a subset by subset basis based at least in part on the order, and output codeword bits from encoding branch subset prior to outputting bits from another encoding branch subsets having a higher order.

Figure 9:
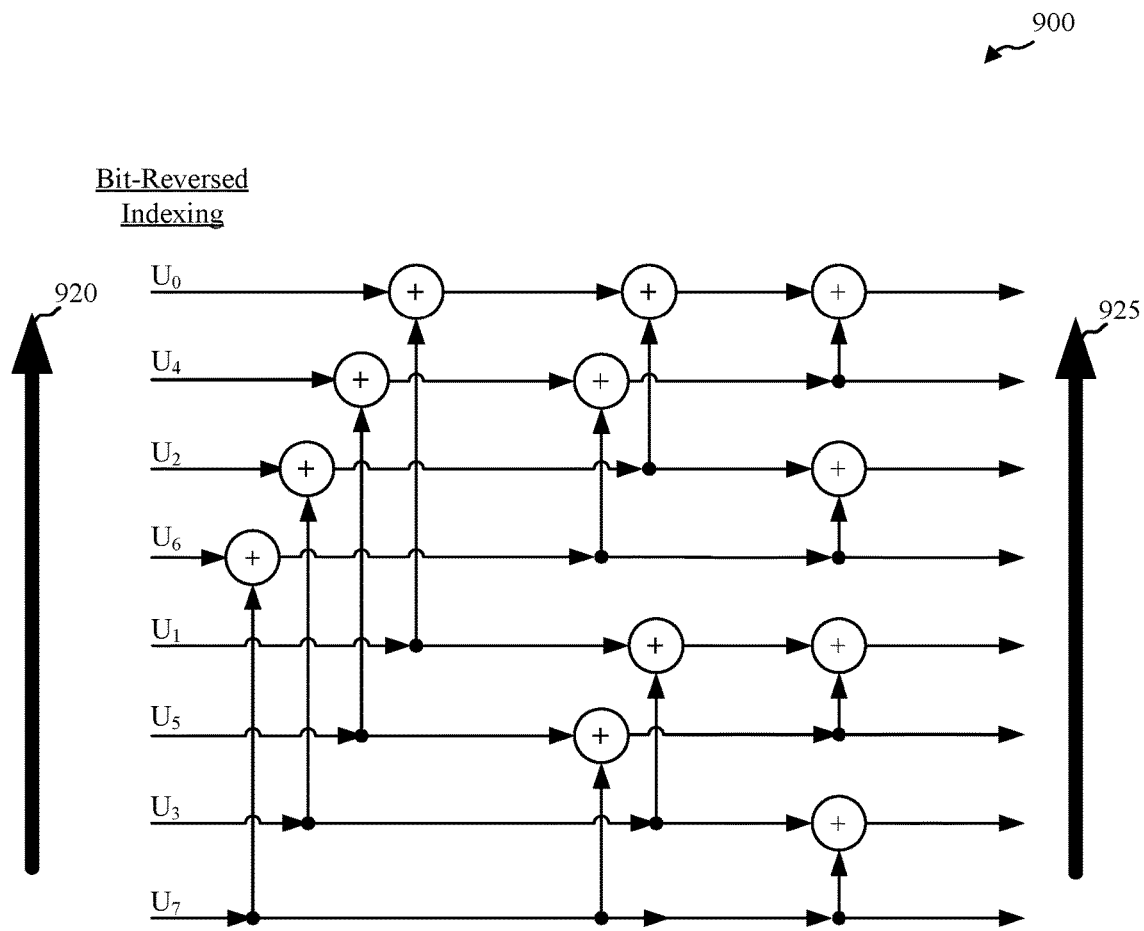
FIG. 9 illustrates an example of a bit-reversed polar encoder that supports outputting of codeword bits for transmission prior to loading all input bits in accordance with one or more aspects of the present disclosure.

The techniques described herein are applicable to bit-reversed polar encoders. FIG. 9 illustrates an example of a bit-reversed polar encoder 900 for outputting of codeword bits for transmission prior to loading all input bits in accordance with one or more aspects of the present disclosure. Polar encoder 900 has encoding branches with bit-reversed indices, which may be compared to encoding branches of the polar encoders shown in FIGS. 3-7 that are in a natural index order. An index refers to the number assigned to a particular encoding branch. An index progressing in sequential order from top to bottom is referred to as a natural index. The polar encoders shown in FIGS. 3-7 are considered to be in a natural index order as the index of each encoding branch increases sequentially starting with $U_0$ at the top, and increasing by 1 until bottom branch $U_7$ is reached.

Bit-reversal refers to the process of reordering encoding branches of an encoder. Instead of proceeding in sequential order from top to bottom, the indices are rearranged and operations are performed in a bit-reversed order. To give an example, the indices are considered to be a p-digit binary code where p is a positive integer. For an 8 bit encoder (e.g., $2^3$), p is 3 where 0 in decimal is represented a 000 in binary, and 7 in decimal is represented by 111 in binary. Bit-reversal means that the bits in a binary representation of an index are reversed. For example, performing bit-reversal on binary number 011 (3 in decimal) is 110 (6 in decimal).

As depicted, encoding branches U of bit-reversed polar encoder 900 are arranged using bit-reversed indices and are in the following order from top to bottom: $U_0$, $U_4$, $U_2$, $U_6$, $U_1$, $U_5$, $U_3$, and $U_7$. In other words, binary number 000 of the top branch is bit-reversed to yield 000 (0 in decimal) after bit-reversal, binary number 001 of the branch second from the top is bit-reversed to yield 100 (4 in decimal), and so forth. Similar to the description of FIG. 6, bits of input bit-vector I may be loaded into bit-reversed polar encoder 900 in generally bottom to top order (see arrow 920), and bit-reversed polar encoder 900 may output bits of codeword C in bottom to top order (see arrow 925).

Bit-reversal may have multiple advantages. In one example, bit-reversal may lead to simpler memory access in a decoder. Bit-reversal may also enable a decoder to start a decoding algorithm as soon as the decoder receives two log likelihood ratio (LLR) values.

Figure 10:
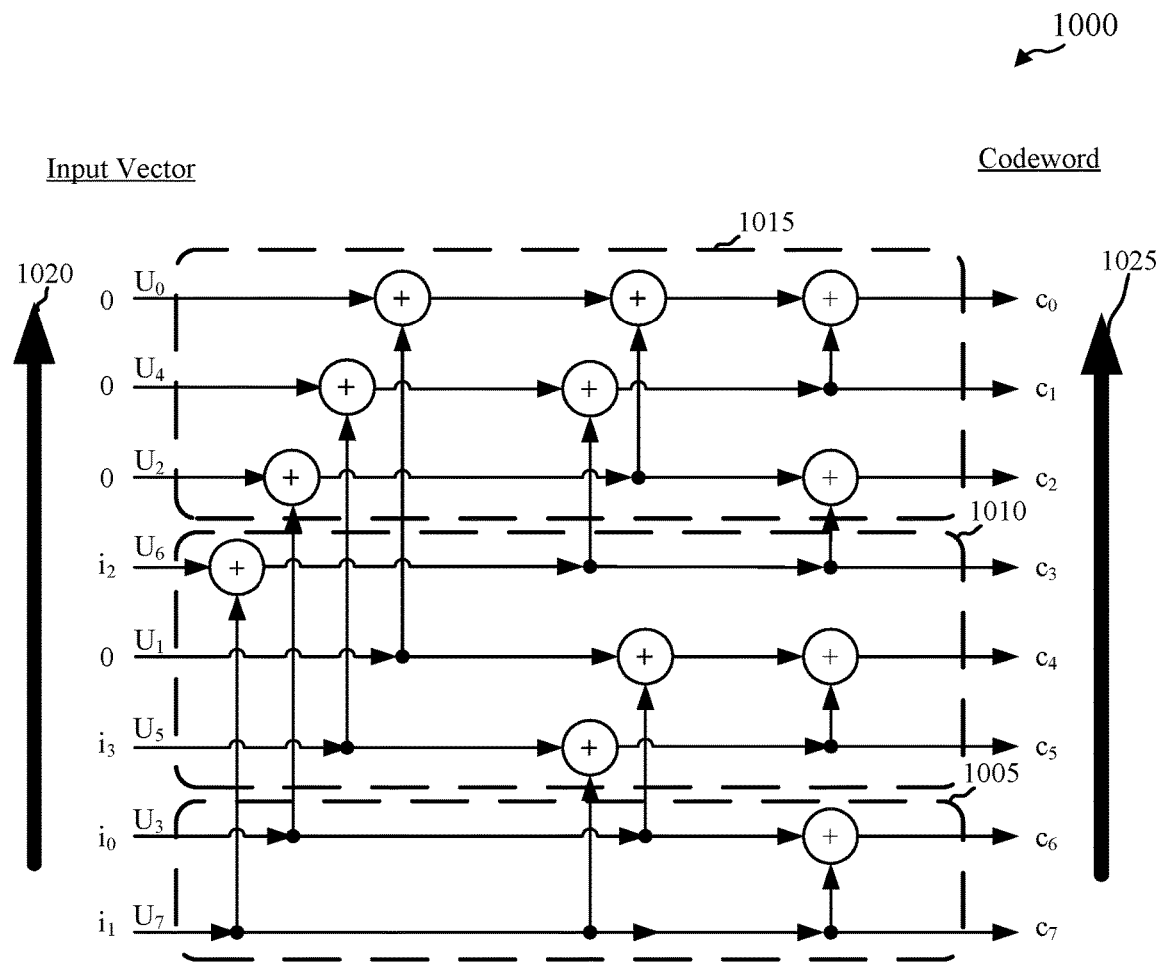
FIG. 10 illustrates an example of a bit-reversed polar encoder that supports outputting of codeword bits for transmission prior to loading all input bits in accordance with one or more aspects of the present disclosure.

A polar encoder in accordance with the examples described herein having bit-reversed indices also has improved encoder latency as compared to conventional techniques. FIG. 10 illustrates an example of a bit-reversed encoder 1000 for outputting of codeword bits for transmission prior to loading all input bits in accordance with one or more aspects of the present disclosure. In this example, information bits of an information bit-vector may be input at a constant rate, similar to the description above of FIG. 6. The principles may also applied a polar encoder having a constant output rate as described in FIG. 7. In the FIG. 6 example, an input vector may include frozen bits, information bits, or both, as described above. Similar to the description of FIG. 6, bits of an input vector may be loaded into bit-reversed polar encoder 1000 in generally bottom to top order (see arrow 1020), and bit-reversed polar encoder 1000 may output bits of codeword C in bottom to top order (see arrow 1025). In the depicted example, the input vector may include an information bit-vector I, which may include one or more information bits (e.g., I=[$i_0$, $i_1$, $i_2$, and $i_3$]). As shown, information bits $i_0$, $i_1$, $i_2$, and $i_3$ are input to encoding branches $U_3$, $U_5$, $U_6$, $U_7$.

Bit-reversed polar encoder 1000 divides encoding branches into three subsets based at least in part on inter-branch encoding dependencies. The first encoding branch subset 1005 has the fewest inter-branch dependencies as encoding its input bits is independent of any other encoding branch subsets. The second encoding branch subset 1010 has the next fewest inter-branch dependencies as encoding its input bits only depends on the input bits to the first and second encoding branch subsets 1005 and 1010. The third encoding branch subset 1015 has the most inter-branch dependencies as encoding its input bits depends on input bits to the first, second, and third encoding branch subsets. As can be seen, outputs for each encoding branch subset are independent of inputs to encoding branches of encoding branch subsets having a higher order. In an example, encoding branch subset 1005 is independent of inputs to higher order subsets 1010, 1015, and encoding branch subset 1010 is independent of inputs to higher order subset 1015. Below is a description of an encoding algorithm applied by bit-reversed polar encoder 1000.

In a first encoding operation, polar encoder 1000 loads a first subset of bits of the input vector into the first encoding branch subset 1005. In particular, bit $i_0$ of information bit-vector I is loaded into branch $U_3$ and bit $i_1$ of information bit-vector I is loaded into branch $U_7$.

In a second encoding operation, the polar encoder 1000 calculates and outputs codeword bits from the first encoding branch subset 1005. In particular, branch $U_3$ outputs codeword bit $c_6$ and branch $U_7$ outputs codeword bit $c_7$. In a third decoding operation, the polar encoder loads a second subset of bits of the input vector into the second encoding branch subset 1010. In particular, bit $i_2$ of information bit-vector I is loaded into branch $U_6$, a frozen bit is loaded into branch $U_1$, and bit $i_3$ of information bit-vector I is loaded into branch $U_5$. Polar encoder 1000 may output codeword bits $c_6$ and $c_7$ prior to outputting other bits of codeword C. Polar encoder 1000 can do so because codeword bits $c_6$ and $c_7$ do not depend on bits loaded to any of the other encoding branch subsets having a higher order. In some cases, the second and third encoding operations may be done concurrently (e.g., a pipelined encoder).

In a fourth encoding operation, the polar encoder 1000 calculates and outputs codeword bits from the second encoding branch subset 1010. In particular, branch $U_6$ outputs codeword bit $c_3$, branch $U_1$ outputs codeword bit $c_4$, and branch $U_5$ outputs codeword bit $c_5$. In a fifth encoding operation, the polar encoder 1000 loads a third subset of bits of the input vector into the third encoding branch subset 1015. In particular, frozen bits are loaded into branches $U_0$, $U_4$, and $U_2$. Polar encoder 1000 may output codeword bit $c_3$, $c_4$ and $c_5$ prior to outputting $c_0$, $c_1$ and $c_2$ of codeword C. Polar encoder 1000 can do so because codeword bits $c_3$, $c_4$ and $c_5$ only depend on bits loaded into the first and second encoding branch subsets 1005 and 1010, but do not depend on bits input to the third encoding branch subset 1015 of higher order. In some cases, the fourth and fifth encoding operations may be done concurrently (e.g., a pipelined encoder).

In a sixth encoding operation, the polar encoder 1000 calculates and outputs codeword bits from the third encoding branch subset 1015. In particular, branch $U_0$ outputs codeword bit $c_0$, branch $U_4$ outputs codeword bit $c_1$, and branch $U_2$ outputs codeword bit $c_2$.

The polar encoder 1000 may thus be considered as having a constant input rate as two information bits of an information bit-vector may be received at a time during a particular operation in the encoding algorithm. An operation of an encoding algorithm may correspond to one or more cycles of a computer processor as described above in FIG. 6. By loading polar encoder 1000 in such a manner, the polar encoder 1000 may output a subset of bits from codeword X for transmission prior to all information bits of an information bit-vector I being available and prior to generating the entire codeword X. Thus, the encoder 1000 may output a subset of bits from a codeword X to a transmitter 215 earlier than conventional techniques. Transmitter 215 may begin and/or complete transmitting the subset of bits of the codeword before a second or final subset of bits of the codeword has been output by the polar encoder 1000.

FIG. 11 illustrates an example of a table 1100 for outputting of codeword bits for transmission prior to loading all input bits in accordance with one or more aspects of the present disclosure. The encoding algorithm using bit-reversed indexing, as described herein, is not limited to providing early transmission of 8-bit codewords. Table 1100 indicates the number of information bits required to transmit each corresponding block of 8 bits of data for a 128-bit codeword. FIG. 11 is similar to the table shown in FIG. 8 and is set up in the same manner. As can be seen, bit-reversed encoding may provide a more balanced distribution of information bits across the columns of the table 1100. In comparing table 800 and table 1100, more information bits in table 800 are encoded in the higher bits of the 128-bit code word (e.g., bit $x_{64}$ and above) than in the lower bits. Table 1100, by comparison, distributes more information bits into the lower bits of the 128-bit code word (e.g., bit $x_{63}$ and below).

Advantageously, the examples described herein provide for a linear block encoder that outputs a subset of bits of a codeword for transmission prior to all input bits being available and prior to generating the entire codeword, thus resulting in reduced encoder latency. Further advantageously, a transmitter may receive the codeword bit subsets from the encoder and begin transmitting codeword bits before an entire codeword is generated. Thus, the examples described herein permit a transmitter to begin transmitting bits of a codeword sooner than in conventional techniques. Also beneficially, information and frozen bits are introduced sequentially to be encoded causally before an entire information bit-vector is processed (e.g., the information bit-vector could be available but prior to a first decoding operation, but decoding operations may be processed in a causal manner that allows earlier transmission of at least some codeword bits). For example, codeword bits may be split across two or more symbols, where a first subset of codeword bits are transmitted prior to the encoder completing processing for all bits of the codeword.

Figure 12:
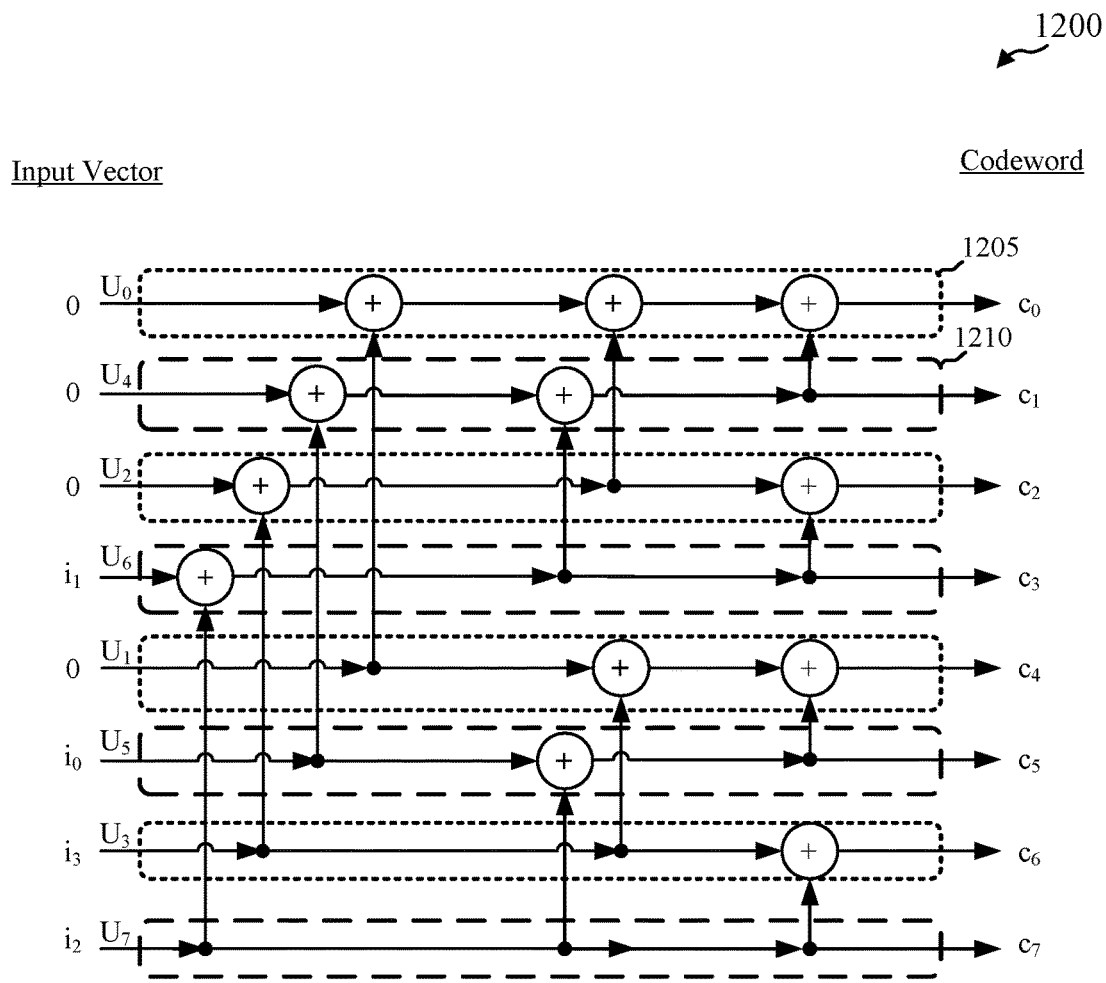
FIG. 12 illustrates an example of a bit-reversed polar encoder that supports outputting of codeword bits for transmission prior to loading all input bits in accordance with one or more aspects of the present disclosure.

The bit-reversed polar encoder may also output codeword bits in sets that provide for simplified memory access by a decoder. FIG. 12 illustrates an example of a bit-reversed polar encoder 1200 for outputting of codeword bits for transmission prior to loading all input bits in accordance with one or more aspects of the present disclosure. The bit-reversed polar encoder 1200 may encode output codeword bits in a manner that simplifies decoding by a decoder. In this example, input indices of the encoding branches may be bit-reversed and output indices of codeword bits output from the encoding branches may be in a sequential order. For comparison, FIG. 5 depicts a non-bit-reversed encoder having input and output indices in sequential order with lower index values depicted at the top encoding branch and sequentially increasing toward the bottom encoding branch. As seen in FIG. 12, the input indices of the encoding branches are bit-reversed (e.g., 000 is bit-reversed to 000, 001 is bit-reversed to 100, 010 is bit-reversed to 010, 011 is bit-reversed to 110, and so forth) whereas the output indices of the codeword bits are in sequential order that increase from top to bottom.

The bit-reversed polar encoder 1200 may output sets of codeword bits c from subsets of encoding branches U corresponding to values of bit-reversed indices of the encoding branches U. In an example, codeword bits c generated by encoding branches U having higher index values are output prior to codeword bits c generated by encoding branches U having lower index values. Reliability metrics may be calculated for the encoding branches, and the encoding branches may be ordered by the calculated reliability metrics. A reliability metric may represent a likelihood of a decoder encountering a decoding error when decoding a codeword bit encoded by a particular encoding branch. The reliability metric may be used for selecting in which encoding branch to input a bit for encoding. The reliability metric may be calculated based on, for example, a polarization weight or density evolution function. In some examples, the frozen bits may be input into the encoding branches having lower reliability while the information bits are input into the encoding branches having higher reliability. In the example shown in FIG. 12, frozen bits are loaded into encoding branches $U_0$, $U_1$, $U_2$, and $U_4$, and information bits $i_0$, $i_1$, $i_2$, and $i_3$ are loaded into encoding branches $U_3$, $U_5$, $U_6$, and $U_7$ for encoding.

In the depicted example, encoding branches of the bit-reversed polar encoder 1200 are divided into two subsets, as seen by a first type of dashed line 1205 defining a first subset having encoding branches $U_0$ to $U_3$ and a second type of dashed line 1210 defining a second subset having encoding branches $U_4$ to $U_7$. Each bit-reversed index value of the encoding branches of the second subset has a higher number than any bit-reversed index value of the encoding branches of the first subset. For example, the bit-reversed index values for the encoding branches of the second subset range from 4 to 7, and the bit-reversed index values for the encoding branches of the first subset range from 0 to 3. The codeword bits $c_1$, $c_3$, $c_5$, and $c_7$ are generated by encoding branches $U_4$ to $U_7$, and the codeword bits $c_0$, $c_2$, $c_4$, and $c_6$ are generated by encoding branches $U_0$ to $U_3$. The bit-reversed polar encoder 1200 may output codeword bits $c_1$, $c_3$, $c_5$, and $c_7$ generated by encoding branches $U_4$ to $U_7$ of the first subset prior to outputting codeword bits $c_0$, $c_2$, $c_4$, and $c_6$ generated by encoding branches $U_0$ to $U_3$ of the second subset. As can been seen in FIG. 12, codeword bits $c_0$, $c_2$, $c_4$, and $c_6$ are dependent on codeword bits $c_1$, $c_3$, $c_5$, and $c_7$ and input bits to encoding branches $U_0$ to $U_3$, and codeword bits $c_1$, $c_3$, $c_5$, and $c_7$ are independent of codeword bits $c_0$, $c_2$, $c_4$, and $c_6$ and bits input to encoding branches $U_0$ to $U_3$. As depicted in FIG. 12, codeword bits of the first subset of encoding branches are interleaved with codeword bits output by the second subset of encoding branches.

Outputting codeword bits, for a bit-reversed polar encoder 1200 having input and output bit locations bit-reversed from each other, in subsets that correspond to the order of the input bits may simplify decoding of the codeword bits by a decoder. The decoder performs the reverse operation as polar encoder 1200 and decodes received codeword bits c in the order of the index values of the encoding branches U. The decoder may look like the polar encoder 1200 with all of the arrows pointed in the opposite direction. During decoding, the codeword bits may be input on the right and the decoded codeword bits may be output at locations $U_0$ to $U_7$. Thus, a bit at location $U_0$ may be decoded first because it relies on the other codeword bits, followed by a bit at location $U_1$, then bit location $U_2$, and so forth in sequential order to bit location $U_7$ Decoding is simplified as the decoder may decode received codeword bits in subsets that correspond to the sequential, bit-reversed index order of the encoding branches U. In an example, the polar encoder 1200 may generate a subset of codeword bits $c_1$, $c_3$, $c_5$, and $c_7$ corresponding to outputs from encoding branches $U_4$ to $U_7$ and output the subset of codeword bits $c_1$, $c_3$, $c_5$, and $c_7$ (e.g., transmit the codeword bits $c_1$, $c_3$, $c_5$, and $c_7$ via a wireless communication channel). Subsequently, the polar encoder 1200 may generate a subset of codeword bits $c_0$, $c_2$, $c_4$, and $c_6$ corresponding to outputs from encoding branches $U_0$ to $U_3$ and output the subset of codeword bits $c_0$, $c_2$, $c_4$, and $c_6$ (e.g., transmit the codeword bits $c_0$, $c_2$, $c_4$, and $c_6$ via a wireless communication channel). A decoder may first receive the subset of codeword bits $c_1$, $c_3$, $c_5$, and $c_7$ and then receive the subset of codeword bits $c_0$, $c_2$, $c_4$, and $c_6$. The decoder may decode the received codeword bits in an order that corresponds to sequential, increasing index values of the encoding branches U. Specifically, the received codeword bits c may be decoded in the following order: $c_0$, $c_4$, $c_2$, $c_6$, $c_1$, $c_5$, $c_3$, and $c_7$, which respectively correspond to encoding branches $U_0$, $U_1$, $U_2$, $U_3$, $U_4$, $U_5$, $U_6$, and $U_7$. Other than having to store a first subset of codeword bits $c_1$, $c_3$, $c_5$, and $c_7$ while waiting for receipt of a second subset of codeword bits $c_0$, $c_2$, $c_4$, and $c_6$, this decoding process simplifies memory access by storing codeword bits in a subsets where the decoder does not have to jump back and forth between the subsets of codeword bits during the decoding process. For instance, the subset of codeword bits $c_0$, $c_2$, $c_4$, and $c_6$ corresponds to encoding branches $U_0$ to $U_3$ and may be decoded prior to decoding any of the codeword bits $c_1$, $c_3$, $c_5$, and $c_7$ in the other subset. In contrast, if, for instance, the first subset included codeword bit $c_1$ that corresponds to encoding branch $U_4$ and the second subset included codeword bit $c_6$ that corresponds to encoding branch $U_3$, the decoder would have to decode codeword bit $c_6$ before decoding codeword bit $c_1$, which results in more complicated memory access.

In some examples, error detecting codes may be used to protect bits input to respective subsets of the encoding branches U of the polar encoder 1200. The error detecting codes may be independent of one another thereby simplifying decoding, as described below. In an example, a bit-reversed polar encoder may have a bit length N, and the N encoding branches (having bit reversed indexes) may be divided into M branch subsets, each branch subset having N/M encoding branches. In an example, a first subset of information bits of an information bit-vector and a first error detecting code (e.g., a cyclic redundancy check) generated from the first subset of information bits may be loaded into information bit locations of the encoding branches of a first branch subset, which may be selected as the highest M bit-reversed indexes. The output bits from the M encoding branches of the first branch subset may be generated and transmitted in a first transmission interval. Subsequently, a second subset of information bits of the information bit-vector and a second error detecting code (e.g., a cyclic redundancy check) generated from the first subset of the information bits, the second subset of the information bits, or both the first and second subsets of the information bits, may be loaded into information bit locations of the encoding branches of a second branch subset, which may be selected as the next-highest M bit-reversed indexes. The second error detecting code may be based on multiple subsets of information bits and may operate as a further check that both the first and second subsets are properly decoded. The output bits from the M encoding branches of the second branch subset may be generated and transmitted in a second transmission interval. The process may be repeated N/M times until all N bits of the codeword have been generated and transmitted.

The decoder may first receive potentially corrupted versions of the subsets of codeword bits associated with each branch subset. The decoder may decode the N bits of the codeword to recover the input bits (e.g., including information bits and error detecting code bits). As described above, the decoder may perform the decoding operation starting at the lowest bit-reversed index and proceeding generally (e.g., some bits may be decoded in parallel if not dependent on each other) in order of increasing bit-reversed index. As the input bits for each branch subset are decoded, the decoder may apply an error detecting algorithm to the decoded subsets of bits associated with each branch subset. If the calculated and received error detecting codes match for a given set of recovered input bits, the decoder determines that the decoding operation was successful and continues decoding further sets of bits. If they don't match, the decoder can indicate a decoding error for the given set of recovered input bits.

Advantageously, the decoder can process a first subset of information bits of an information bit-vector encoded by a first subset of encoding branches that have an error detecting code that is independent of an error detecting code generated for a second (or subsequent) subset of received information bits of the information bit-vector encoded by a second (or subsequent) subset of encoding branches. The error detecting codes do not depend on one another, and a decoding error identified by one error detecting code is independent of a decoding error identified by another error detecting code. Thus, each subset of information bits of the information bit-vector is protected by a separate error detecting code. Decoding each subset of bits independently with its own error detecting code reduces coding gain of the codeword, but allows independent decoding of subsets of bits of the codewords that may be transmitted in different transmission intervals (e.g., symbol periods, etc.).

The techniques for using separate error detecting codes for subsets of encoding branches described with reference to the bit-reversed polar encoder 1200 may also be applied to a non-bit-reversed polar encoder. For example, a non-bit-reversed polar encoder (or other device) may group, into subsets, codeword bits generated by encoding branches with indices having adjacent numbers, without any gaps between the adjacent numbers within a particular subset, and may communicate each of the subsets (e.g., via a wireless communication channel) to a decoder. Because the codeword bits in each subset are generated by encoding branches with indices having adjacent numbers, the decoder can decode codeword bits in a current subset without having to jump back and forth to decode codeword bits from a one or more different subsets before completing decoding bits of a current subset.

Figure 13:
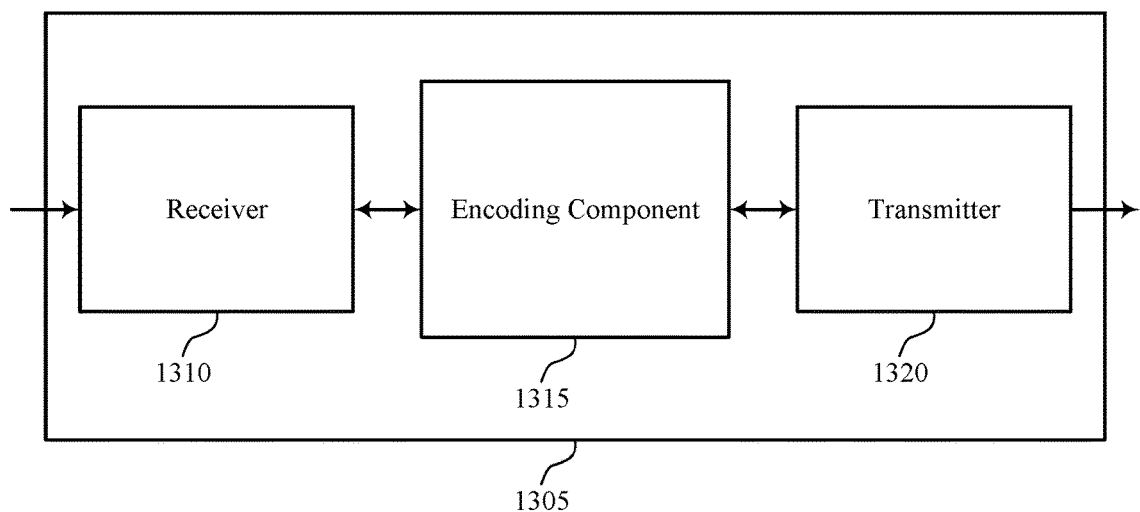
FIGS. 13 through 15 show block diagrams of a device that supports outputting of codeword bits for transmission prior to loading all input bits in accordance with one or more aspects of the present disclosure.

FIG. 13 shows a block diagram 1300 of a wireless device 1305 that supports outputting of codeword bits for transmission prior to loading all input bits in accordance with one or more aspects of the present disclosure. Wireless device 1305 may be an example of aspects of a user equipment (UE) 115 or base station 105 as described with reference to FIG. 1. Wireless device 1305 may include receiver 1310, encoding component 1315, and transmitter 1320. Wireless device 1305 may also include a processor. Each of these components may be in communication with one another (e.g., via one or more buses).

Receiver 1310 may receive a signal including information such as packets, user data, or control information associated with various information channels (e.g., control channels, data channels, etc.). The receiver 1310 may process (e.g., downconvert, filter, perform analog-to-digital conversion, etc.) and pass information on to other components of the device. The receiver 1310 may be an example of aspects of the transceiver 1635 described with reference to FIG. 16.

Encoding component 1315 may be an example of aspects of the encoding component 1515 described with reference to FIG. 15.

Encoding component 1315 may divide a plurality of encoding branches into at least a first encoding branch subset and a second encoding branch subset, outputs of the first encoding branch subset being independent of inputs to the second encoding branch subset. Encoding component 1315 may generate first and second subsets of output bits of a codeword in first and second encoding operations. In some cases, the generating may include inputting information bits of an information bit-vector and at least one frozen bit into respective encoding branches of the plurality of encoding branches and generating the first subset of output bits using the first encoding branch subset prior to generating the second subset of output bits using the second encoding branch subset. Encoding component 1315 may output the first subset of output bits prior to outputting the second subset of output bits.

Transmitter 1320 may transmit signals generated by other components of the device. In some cases, the transmitter 1420 may transmit the first subset of output bits prior to transmitting the second subset of output bits. In some cases, the transmitter 1320 may transmit at least some, or all, of the first subset of output bits prior to transmitting any of, some of, or all of the second subset of output bits. In some examples, the transmitter 1320 may be collocated with a receiver 1310 in a transceiver module. For example, the transmitter 1320 may be an example of aspects of the transceiver 1635 described with reference to FIG. 16. The transmitter 1320 may include a single antenna, or it may include a set of antennas.

Figure 14:
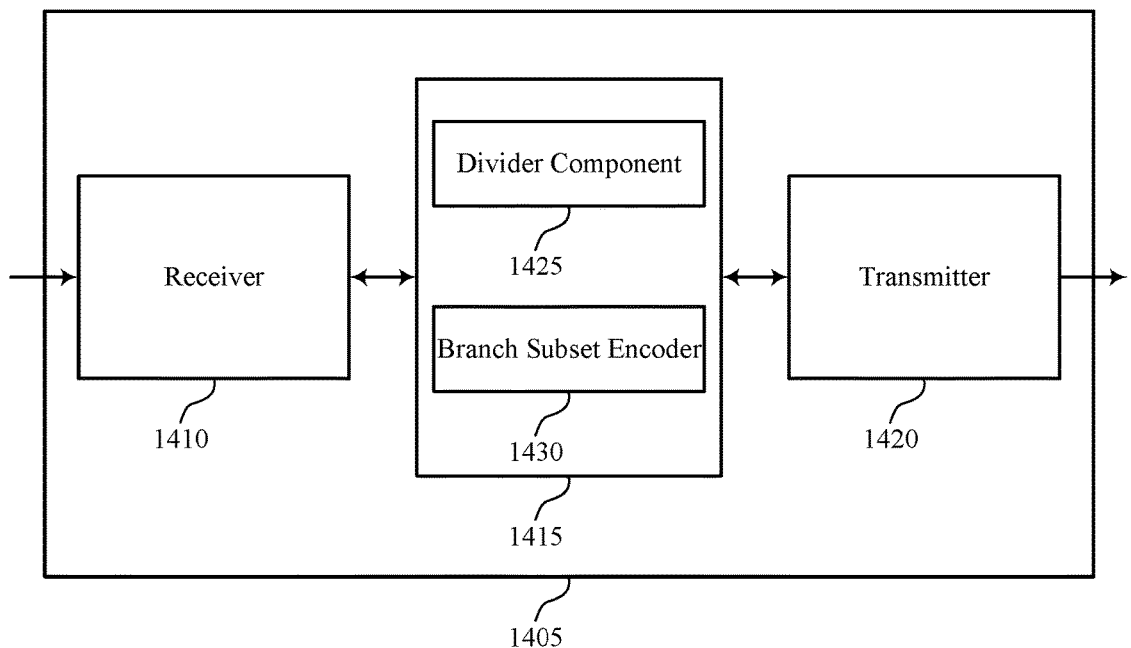

FIG. 14 shows a block diagram 1400 of a wireless device 1405 that supports outputting of codeword bits for transmission prior to loading all input bits in accordance with one or more aspects of the present disclosure. Wireless device 1405 may be an example of aspects of a wireless device 1305 or a UE 115 or base station 105 as described with reference to FIGS. 1 and 12. Wireless device 1405 may include receiver 1410, encoding component 1415, and transmitter 1420. Wireless device 1405 may also include a processor. Each of these components may be in communication with one another (e.g., via one or more buses).

Receiver 1410 may receive a signal including information such as packets, user data, or control information associated with various information channels (e.g., control channels, data channels, etc.). The receiver 1410 may process (e.g., downconvert, filter, perform analog-to-digital conversion, etc.) and pass information on to other components of the device. The receiver 1410 may be an example of aspects of the transceiver 1635 described with reference to FIG. 16.

Encoding component 1415 may be an example of aspects of the encoding component 1515 described with reference to FIG. 15. Encoding component 1415 may also include Divider Component 1425 and Branch Subset Encoder 1430.

Divider Component 1425 may divide a plurality of encoding branches into at least a first encoding branch subset and a second encoding branch subset, outputs of the first encoding branch subset being independent of inputs to the second encoding branch subset.

Branch Subset Encoder 1430 may generate first and second subsets of output bits of a codeword in first and second encoding operations. In some cases, the generating may include inputting information bits of an information bit-vector and at least one frozen bit into respective encoding branches of the plurality of encoding branches and generating the first subset of output bits using the first encoding branch subset prior to generating the second subset of output bits using the second encoding branch subset. Branch Subset Encoder 1430 may output the first subset of output bits prior to outputting the second subset of output bits.

Transmitter 1420 may transmit signals generated by other components of the device. In some cases, the transmitter 1420 may transmit the first subset of output bits prior to transmitting the second subset of output bits. In some cases, the transmitter 1320 may transmit at least some, or all, of the first subset of output bits prior to transmitting any of, some of, or all of the second subset of output bits. In some examples, the transmitter 1420 may be collocated with a receiver 1410 in a transceiver module. For example, the transmitter 1420 may be an example of aspects of the transceiver 1635 described with reference to FIG. 16. The transmitter 1420 may include a single antenna, or it may include a set of antennas.

Figure 15:
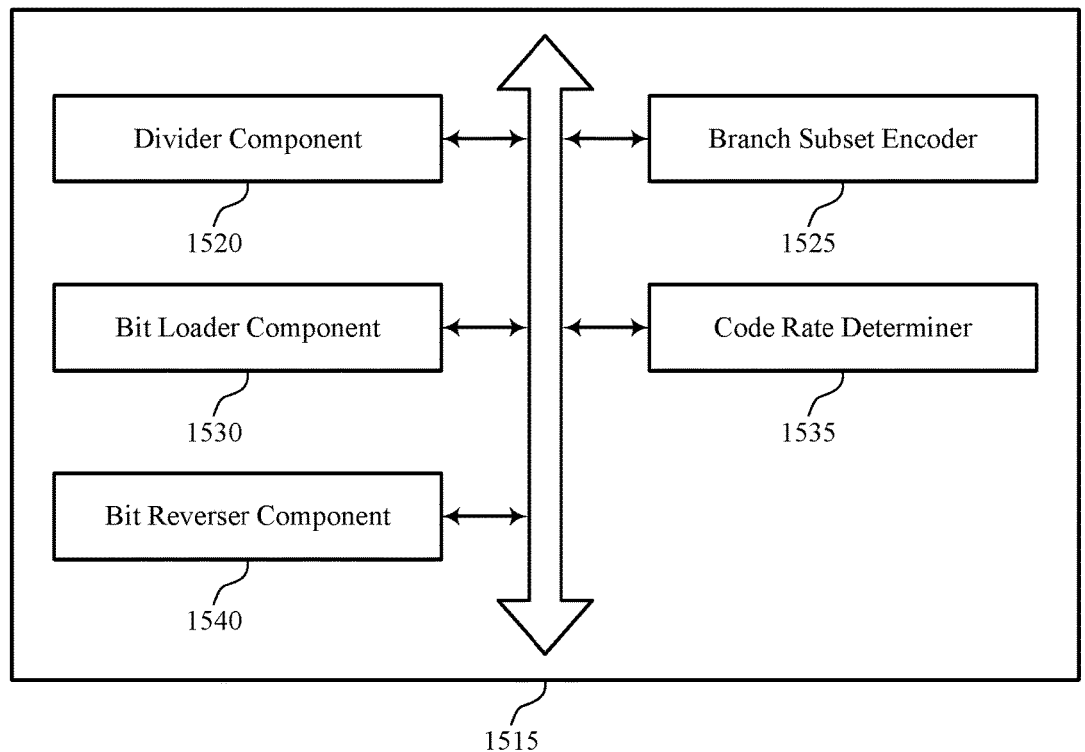

FIG. 15 shows a block diagram 1500 of an encoding component 1515 that supports outputting of codeword bits for transmission prior to loading all input bits in accordance with one or more aspects of the present disclosure. The encoding component 1515 may be an example of aspects of an encoding component 1315 or an encoding component 1415 described with reference to FIGS. 13, and 14. The encoding component 1515 may include Divider Component 1520, Branch Subset Encoder 1525, Bit Loader Component 1530, Code Rate Determiner 1535, and Bit Reverser Component 1540. Each of these modules may communicate, directly or indirectly, with one another (e.g., via one or more buses).

Divider Component 1520 may divide the plurality of encoding branches into at least a first encoding branch subset and a second encoding branch subset, outputs of the first encoding branch subset being independent of inputs to the second encoding branch subset.

Branch Subset Encoder 1525 may generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset. Branch Subset Encoder 1525 may output the first subset of output bits prior to outputting the second subset of output bits.

In some cases, generating the first and second subsets of output bits of the codeword in first and second encoding operations includes: inputting a first subset of the information bits of the information bit-vector and a first error detecting code generated from the first subset of the information bits to encoding branches of the first encoding branch subset for generating the first subset of output bits, and inputting a second subset of the information bits of the information bit-vector and a second error detecting code generated from the first subset of the information bits, the second subset of the information bits, or both the first and second subsets of the information bits, to encoding branches of the second encoding branch subset for generating the second subset of output bits. In some cases, each of the subsets, including the first and second subsets, of output bits have a same number of bits. In some cases, the first subset of output bits has a different number of bits than the second subset of output bits. In some cases, the information bits of the information bit-vector for generating the codeword may be received at a constant rate or a variable rate. In some cases, the encoder is a linear block encoder. In some cases, the linear block encoder is one of a polar code encoder, a Reed-Muller (RM) encoder, a polar RM encoder, a systematic encoder, and a bit-reversed encoder.

Bit Loader Component 1530 may receive a first of a plurality of subsets of bits from an information bit-vector prior to receiving a last of the plurality of subsets of the bits from the input vector. In some cases, the outputting of the first subset of output bits is performed prior to receiving of the last of the plurality of subsets of the information bits from the information bit-vector.

Code Rate Determiner 1535 may determine a code rate for encoding by selecting a number of frozen bits for input to the set of encoding branches.

Bit Reverser Component 1540 may perform bit-reversal on input indices of the plurality of encoding branches relative to corresponding output indices of the plurality of encoding branches prior to the dividing of the plurality of encoding branches. In some cases, a first subset of the bit-reversed indices correspond to the first encoding branch subset and a second subset of the bit-reversed indices correspond to the second encoding branch subset, and where each bit-reversed index in the first subset of the bit-reversed indices has a higher number than each bit-reversed index in the second subset of the bit-reversed indices. In some cases, the first subset of output bits correspond to a first subset of the output indices of the set of encoding branches and the second subset of output bits correspond to a second subset of the output indices of the set of encoding branches, and where the first subset of the output indices and the second subset of the output indices are interleaved with each other. In some cases, the second subset of output bits is dependent on the first subset of output bits and bits input to the second encoding branch subset.

Figure 16:
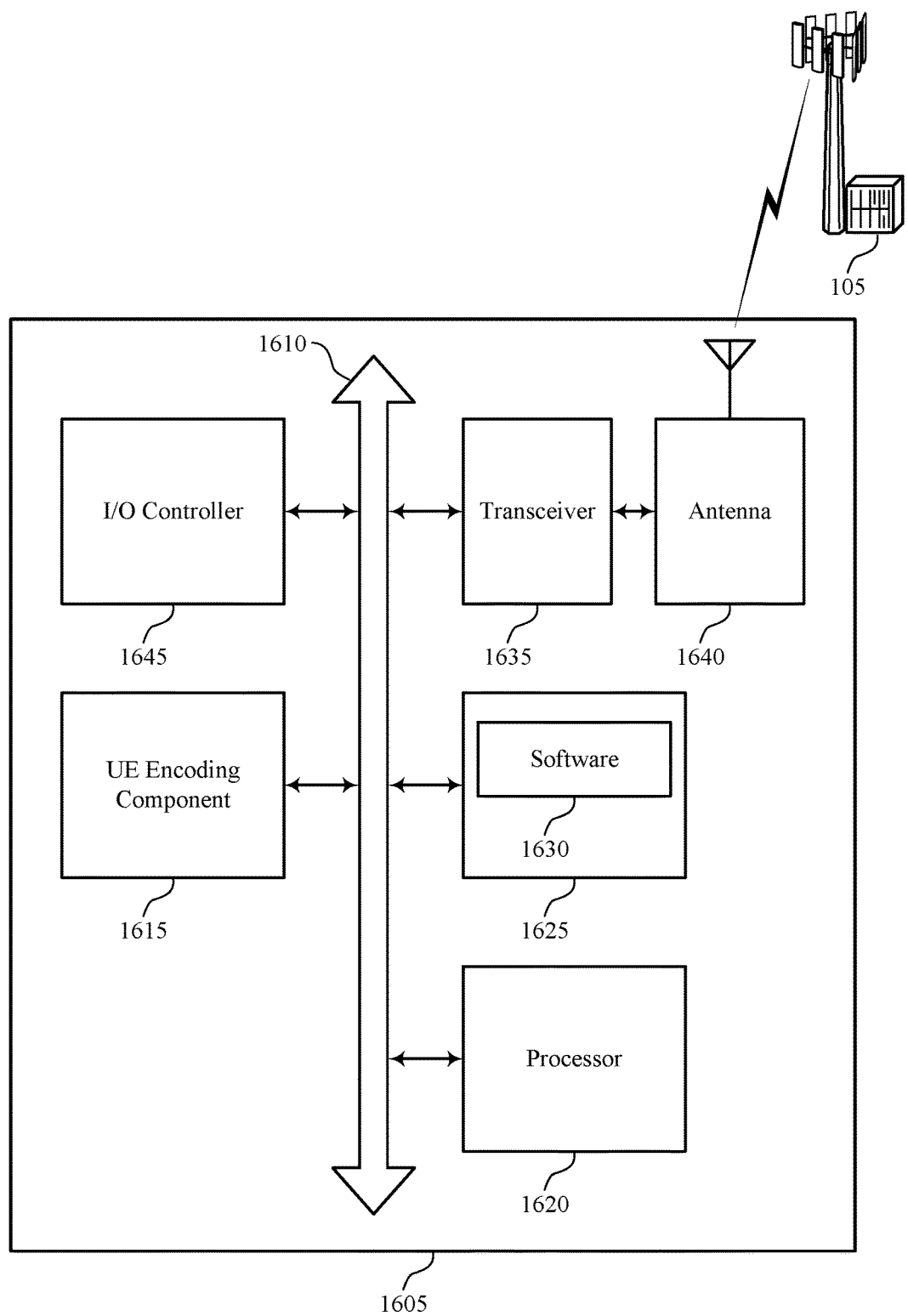
FIG. 16 illustrates a block diagram of a system including a UE that supports outputting of codeword bits for transmission prior to loading all input bits in accordance with one or more aspects of the present disclosure.

FIG. 16 shows a diagram of a system 1600 including a device 1605 that supports outputting of codeword bits for transmission prior to loading all input bits in accordance with one or more aspects of the present disclosure. Device 1605 may be an example of or include the components of wireless device 1305, wireless device 1405, or a UE 115 as described above, e.g., with reference to FIGS. 1, 12 and 13. Device 1605 may include components for bi-directional voice and data communications including components for transmitting and receiving communications, including UE encoding component 1615, processor 1620, memory 1625, software 1630, transceiver 1635, antenna 1640, and I/O controller 1645. These components may be in electronic communication via one or more busses (e.g., bus 1610). Device 1605 may communicate wirelessly with one or more base stations 105.

Processor 1620 may include an intelligent hardware device, (e.g., a general-purpose processor, a digital signal processor (DSP), a central processing unit (CPU), a microcontroller, an application-specific integrated circuit (ASIC), an field-programmable gate array (FPGA), a programmable logic device, a discrete gate or transistor logic component, a discrete hardware component, or any combination thereof). In some cases, processor 1620 may be configured to operate a memory array using a memory controller. In other cases, a memory controller may be integrated into processor 1620. Processor 1620 may be configured to execute computer-readable instructions stored in a memory to perform various functions (e.g., functions or tasks supporting outputting of codeword bits for transmission prior to loading all input bits).

Memory 1625 may include random access memory (RAM) and read only memory (ROM). The memory 1625 may store computer-readable, computer-executable software 1630 including instructions that, when executed, cause the processor to perform various functions described herein. In some cases, the memory 1625 may contain, among other things, a basic input/output system (BIOS) which may control basic hardware and/or software operation such as the interaction with peripheral components or devices.

Software 1630 may include code to implement aspects of the present disclosure, including code to support outputting of codeword bits for transmission prior to loading all input bits. Software 1630 may be stored in a non-transitory computer-readable medium such as system memory or other memory. In some cases, the software 1630 may not be directly executable by the processor but may cause a computer (e.g., when compiled and executed) to perform functions described herein.

Transceiver 1635 may communicate bi-directionally, via one or more antennas, wired, or wireless links as described above. For example, the transceiver 1635 may represent a wireless transceiver and may communicate bi-directionally with another wireless transceiver. The transceiver 1635 may also include a modem to modulate the packets and provide the modulated packets to the antennas for transmission, and to demodulate packets received from the antennas.

In some cases, the wireless device may include a single antenna 1640. However, in some cases the device may have more than one antenna 1640, which may be capable of concurrently transmitting or receiving multiple wireless transmissions.

I/O controller 1645 may manage input and output signals for device 1605. I/O controller 1645 may also manage peripherals not integrated into device 1605. In some cases, I/O controller 1645 may represent a physical connection or port to an external peripheral. In some cases, I/O controller 1645 may utilize an operating system such as iOS®, ANDROID®, MS-DOS®, MS-WINDOWS®, OS/2®, UNIX®, LINUX®, or another known operating system.

Figure 17:
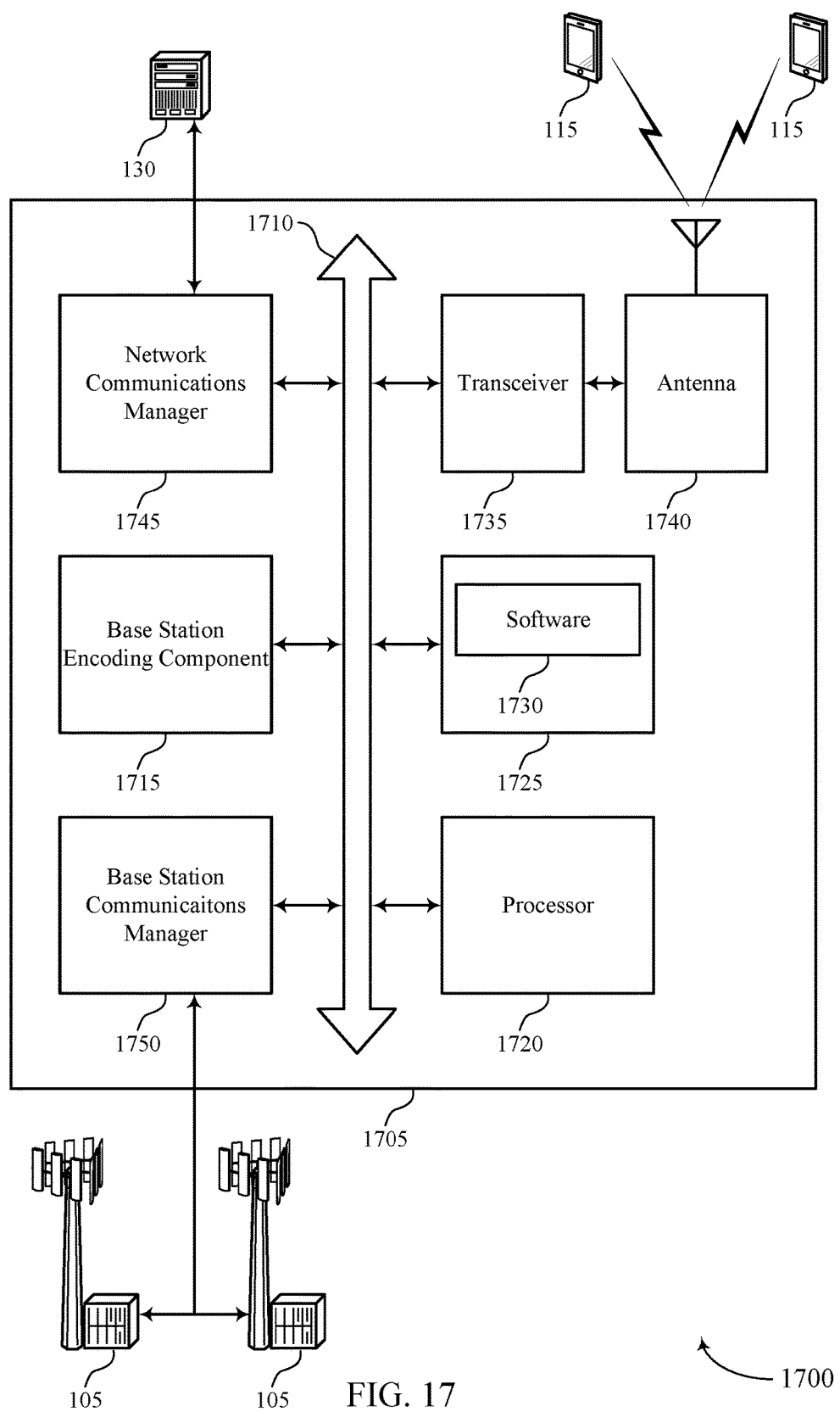
FIG. 17 illustrates a block diagram of a system including a base station that supports outputting of codeword bits for transmission prior to loading all input bits in accordance with one or more aspects of the present disclosure.

FIG. 17 shows a diagram of a system 1700 including a device 1705 that supports outputting of codeword bits for transmission prior to loading all input bits in accordance with one or more aspects of the present disclosure. Device 1705 may be an example of or include the components of wireless device 1305, wireless device 1405, or a base station 105 as described above, e.g., with reference to FIGS. 1, 13 and 14. Device 1705 may include components for bi-directional voice and data communications including components for transmitting and receiving communications, including base station encoding component 1715, processor 1720, memory 1725, software 1730, transceiver 1735, antenna 1740, network communications manager 1745, and base station communications manager 1750. These components may be in electronic communication via one or more busses (e.g., bus 1710). Device 1705 may communicate wirelessly with one or more UEs 115.

Base station encoding component 1715 may divide the plurality of encoding branches into at least a first encoding branch subset and a second encoding branch subset, outputs of the first encoding branch subset being independent of inputs to the second encoding branch subset. Base station encoding component 1715 may generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset. Base station encoding component 1715 may output the first subset of output bits prior to outputting the second subset of output bits.

Processor 1720 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1720 may be configured to operate a memory array using a memory controller. In other cases, a memory controller may be integrated into processor 1720. Processor 1720 may be configured to execute computer-readable instructions stored in a memory to perform various functions (e.g., functions or tasks supporting outputting of codeword bits for transmission prior to loading all input bits).

Memory 1725 may include RAM and ROM. The memory 1725 may store computer-readable, computer-executable software 1630 including instructions that, when executed, cause the processor to perform various functions described herein. In some cases, the memory 1725 may contain, among other things, a BIOS which may control basic hardware and/or software operation such as the interaction with peripheral components or devices.

Software 1730 may include code to implement aspects of the present disclosure, including code to support outputting of codeword bits for transmission prior to loading all input bits. Software 1730 may be stored in a non-transitory computer-readable medium such as system memory or other memory. In some cases, the software 1730 may not be directly executable by the processor but may cause a computer (e.g., when compiled and executed) to perform functions described herein.

Transceiver 1735 may communicate bi-directionally, via one or more antennas, wired, or wireless links as described above. For example, the transceiver 1735 may represent a wireless transceiver and may communicate bi-directionally with another wireless transceiver. The transceiver 1735 may also include a modem to modulate the packets and provide the modulated packets to the antennas for transmission, and to demodulate packets received from the antennas.

In some cases, the wireless device may include a single antenna 1740. However, in some cases the device may have more than one antenna 1740, which may be capable of concurrently transmitting or receiving multiple wireless transmissions.

Network communications manager 1745 may manage communications with the core network (e.g., via one or more wired backhaul links). For example, the network communications manager 1745 may manage the transfer of data communications for client devices, such as one or more UEs 115.

Base station communications manager 1750 may manage communications with other base station 105, and may include a controller or scheduler for controlling communications with UEs 115 in cooperation with other base stations 105. For example, the base station communications manager 1750 may coordinate scheduling for transmissions to UEs 115 for various interference mitigation techniques such as beamforming or joint transmission. In some examples, base station communications manager 1750 may provide an X2 interface within an LTE/LTE-A wireless communication network technology to provide communication between base stations 105.

Figure 18:
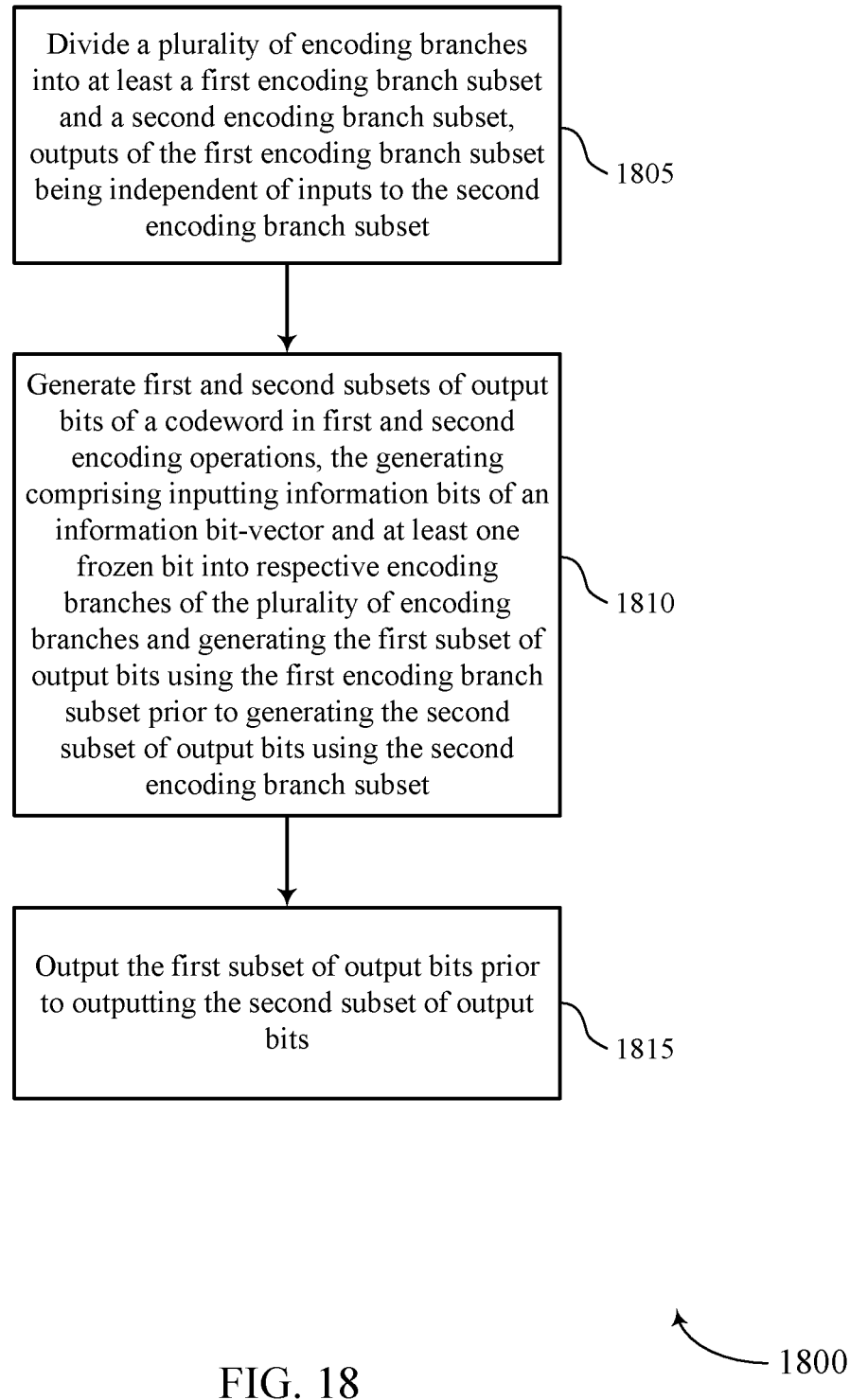
FIGS. 18 through 20 illustrate methods for outputting of codeword bits for transmission prior to loading all input bits in accordance with one or more aspects of the present disclosure.

FIG. 18 shows a flowchart illustrating a method 1800 for outputting of codeword bits for transmission prior to loading all input bits in accordance with one or more aspects of the present disclosure. The operations of method 1800 may be implemented by a UE 115 or base station 105 or its components as described herein. For example, the operations of method 1800 may be performed by an encoding component as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects the functions described below using special-purpose hardware.

At block 1805 the UE 115 or base station 105 may divide a plurality of encoding branches into at least a first encoding branch subset and a second encoding branch subset, outputs of the first encoding branch subset being independent of inputs to the second encoding branch subset. The operations of block 1805 may be performed according to the methods described with reference to FIGS. 1 through 12. In certain examples, aspects of the operations of block 1805 may be performed by a Divider Component as described with reference to FIGS. 13 through 15.

At block 1810 the UE 115 or base station 105 may generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset. The operations of block 1810 may be performed according to the methods described with reference to FIGS. 1 through 12. In certain examples, aspects of the operations of block 1810 may be performed by a Branch Subset Encoder as described with reference to FIGS. 13 through 15.

At block 1815 the UE 115 or base station 105 may output the first subset of output bits prior to outputting the second subset of output bits. The operations of block 1815 may be performed according to the methods described with reference to FIGS. 1 through 12. In certain examples, aspects of the operations of block 1815 may be performed by a Branch Subset Encoder as described with reference to FIGS. 13 through 15.

Figure 19:
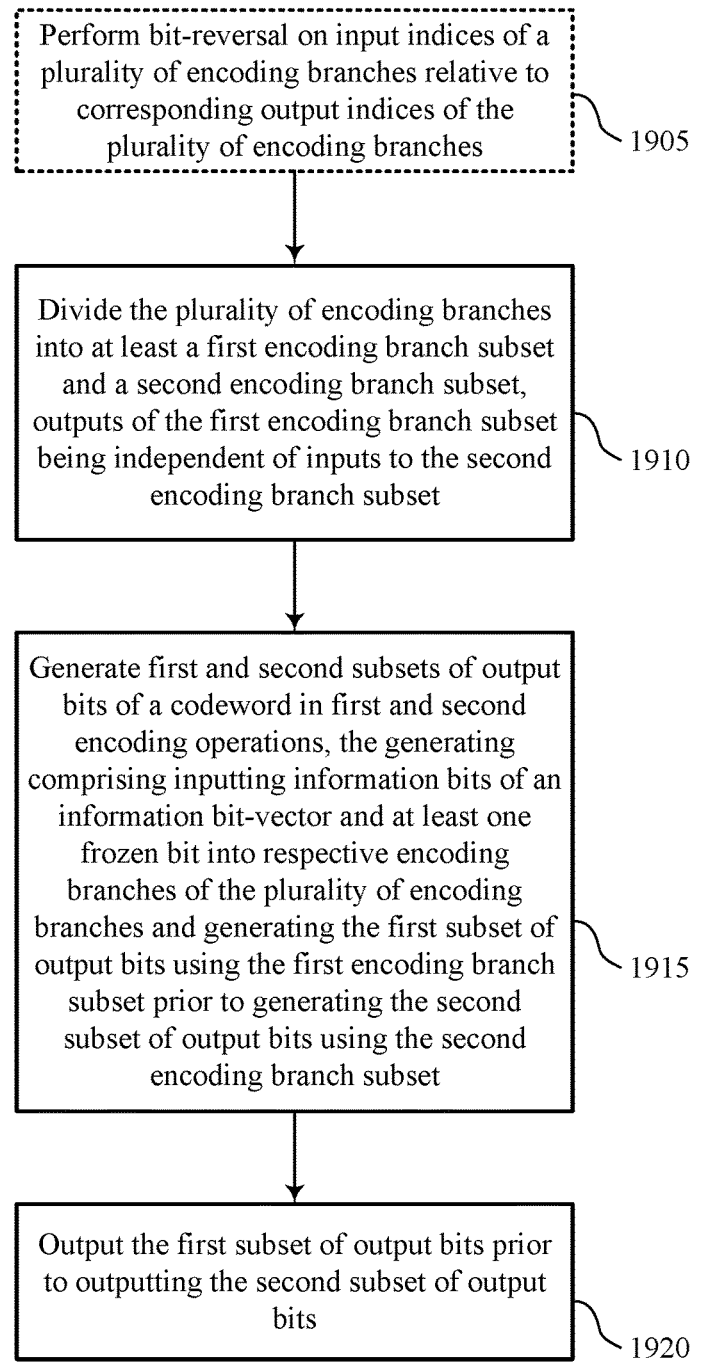

FIG. 19 shows a flowchart illustrating a method 1900 for outputting of codeword bits for transmission prior to loading all input bits in accordance with one or more aspects of the present disclosure. The operations of method 1900 may be implemented by a UE 115 or base station 105 or its components as described herein. For example, the operations of method 1900 may be performed by an encoding component as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects the functions described below using special-purpose hardware.

At block 1905 the UE 115 or base station 105 may perform bit-reversal on input indices of a plurality of encoding branches relative to corresponding output indices of the plurality of encoding branches prior to dividing of the plurality of encoding branches. The operations of block 1905 may be performed according to the methods described with reference to FIGS. 1 through 12. Block 1905 is shown using a dashed line as it is optional and may be skipped. In certain examples, aspects of the operations of block 1905 may be performed by a Bit Reverser Component as described with reference to FIGS. 13 through 15.

At block 1910 the UE 115 or base station 105 may divide the plurality of encoding branches into at least a first encoding branch subset and a second encoding branch subset, outputs of the first encoding branch subset being independent of inputs to the second encoding branch subset. The operations of block 1910 may be performed according to the methods described with reference to FIGS. 1 through 12. In certain examples, aspects of the operations of block 1910 may be performed by a Divider Component as described with reference to FIGS. 13 through 15.

At block 1915 the UE 115 or base station 105 may generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset. The operations of block 1915 may be performed according to the methods described with reference to FIGS. 1 through 12. In certain examples, aspects of the operations of block 1915 may be performed by a Branch Subset Encoder as described with reference to FIGS. 13 through 15.

At block 1920 the UE 115 or base station 105 may output the first subset of output bits prior to outputting the second subset of output bits. The operations of block 1920 may be performed according to the methods described with reference to FIGS. 1 through 12. In certain examples, aspects of the operations of block 1920 may be performed by a Branch Subset Encoder as described with reference to FIGS. 13 through 15.

Figure 20:
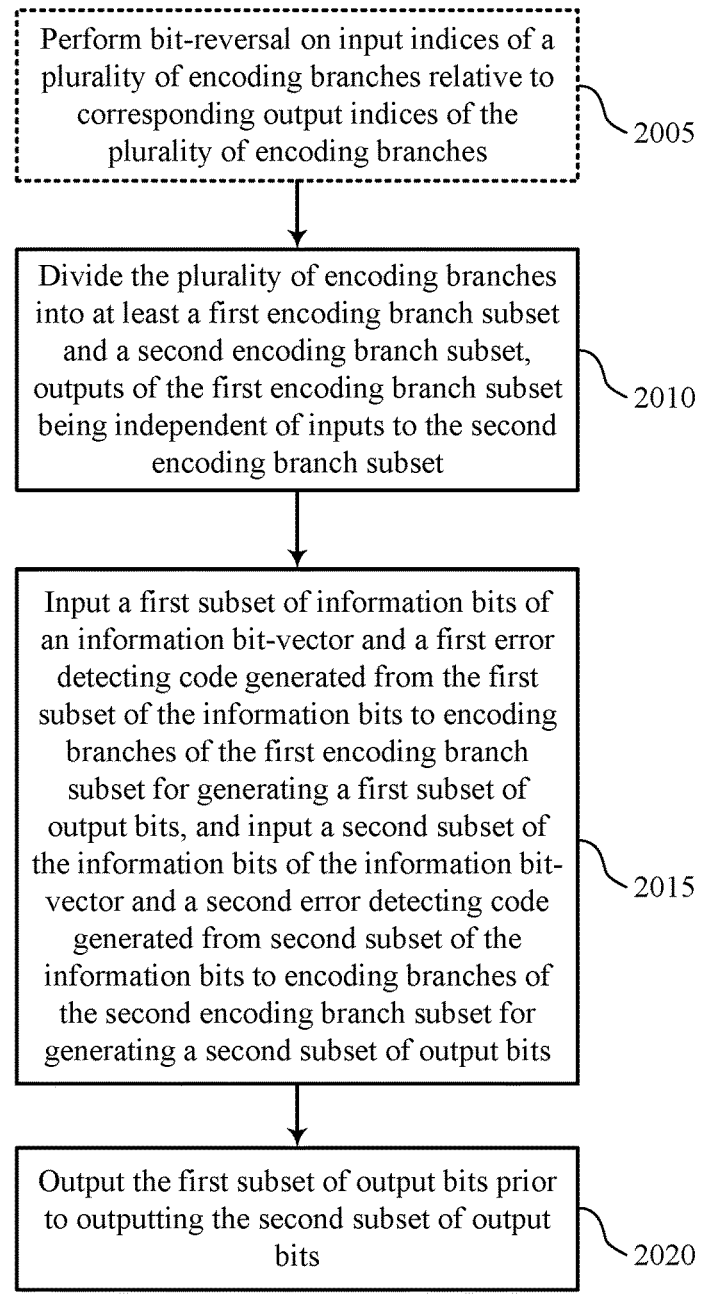

FIG. 20 shows a flowchart illustrating a method 2000 for outputting of codeword bits for transmission prior to generating entire codeword in accordance with various aspects of the present disclosure. The operations of method 2000 may be implemented by a UE 115 or base station 105 or its components as described herein. For example, the operations of method 2000 may be performed by a communications manager as described with reference to FIGS. 13 through 15. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 2005 the UE 115 or base station 105 may perform bit-reversal on input indices of a plurality of encoding branches relative to corresponding output indices of the plurality of encoding branches prior to dividing of the plurality of encoding branches. The operations of block 2005 may be performed according to the methods described with reference to FIGS. 1 through 12. Block 2005 is shown using a dashed line as it is optional and may be skipped. In certain examples, aspects of the operations of block 2005 may be performed by a Bit Reverser Component as described with reference to FIG. 15.

At block 2010 the UE 115 or base station 105 may divide the plurality of encoding branches into at least a first encoding branch subset and a second encoding branch subset, outputs of the first encoding branch subset being independent of inputs to the second encoding branch subset. The operations of block 2010 may be performed according to the methods described with reference to FIGS. 1 through 12. In certain examples, aspects of the operations of block 2010 may be performed by a Divider Component as described with reference to FIGS. 13 through 15.

At block 2015 the UE 115 or base station 105 may input a first subset of information bits of an information bit-vector and a first error detecting code generated from the first subset of the information bits to encoding branches of the first encoding branch subset for generating a first subset of output bits, and input a second subset of the information bits of the information bit-vector and a second error detecting code generated from the first subset of the information bits, the second subset of the information bits, or both the first and second subsets of the information bits, to encoding branches of the second encoding branch subset for generating a second subset of output bits. The operations of block 2015 may be performed according to the methods described with reference to FIGS. 1 through 12. In certain examples, aspects of the operations of block 2015 may be performed by a Branch Subset Encoder as described with reference to FIGS. 13 through 15.

At block 2020 the UE 115 or base station 105 may output the first subset of output bits prior to outputting the second subset of output bits. The operations of block 2015 may be performed according to the methods described with reference to FIGS. 1 through 12. In certain examples, aspects of the operations of block 2020 may be performed by a Bit Reverser Component as described with reference to FIGS. 13 through 15.

It should be noted that the methods described above describe possible implementations, and that the operations may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A time division multiple access (TDMA) system may implement a radio technology such as Global System for Mobile Communications (GSM).

An orthogonal frequency division multiple access (OFDMA) system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP Long Term Evolution (LTE) and LTE-Advanced (LTE-A) are new releases of Universal Mobile Telecommunications System (UMTS) that use E-UTRA. UTRA, E-UTRA, UMTS, LTE, LTE-A, and Global System for Mobile communications (GSM) are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE system may be described for purposes of example, and LTE terminology may be used in much of the description, the techniques described herein are applicable beyond LTE applications.

In LTE/LTE-A networks, including such networks described herein, the term evolved node B (eNB) may be generally used to describe the base stations. The wireless communications system or systems described herein may include a heterogeneous LTE/LTE-A network in which different types of evolved node B (eNBs) provide coverage for various geographical regions. For example, each eNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary operation that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for encoding by an encoder comprising a plurality of encoding branches, the method comprising:
    dividing the plurality of encoding branches into at least a first encoding branch subset and a second encoding branch subset, outputs of the first encoding branch subset being independent of inputs to the second encoding branch subset;
    generating first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset;
    outputting, from the encoder, the first subset of output bits prior to outputting the second subset of output bits; and
    transmitting, via a wireless communication channel, the first subset of output bits prior to transmitting, via a wireless communication channel, the second subset of output bits.

2. The method of claim 1, further comprising:
    receiving, at the encoder, a first of a plurality of subsets of the information bits of the information bit-vector prior to receiving a last of the plurality of subsets of the information bits from the information bit-vector.

3. The method of claim 2, wherein the outputting of the first subset of output bits is performed prior to the receiving of the last of the plurality of subsets of the information bits of the information bit-vector.

4. The method of claim 1, further comprising:
    receiving, by the encoder, the information bits of the information bit-vector for generating the codeword at a constant rate.

5. The method of claim 1, further comprising:
    receiving, by the encoder, the information bits of the information bit-vector for generating the codeword at a variable rate.

6. The method of claim 1, further comprising:
    determining a code rate for the encoding by selecting a number of frozen bits for input to the plurality of encoding branches.

7. The method of claim 1, further comprising:
    performing bit-reversal on input indices of the plurality of encoding branches relative to corresponding output indices of the plurality of encoding branches prior to the dividing of the plurality of encoding branches.

8. The method of claim 7, wherein a first subset of the bit-reversed indices correspond to the first encoding branch subset and a second subset of the bit-reversed indices correspond to the second encoding branch subset, and wherein each bit-reversed index in the first subset of the bit-reversed indices has a higher number than each bit-reversed index in the second subset of the bit-reversed indices.

9. The method of claim 8, wherein the first subset of output bits correspond to a first subset of the output indices of the plurality of encoding branches and the second subset of output bits correspond to a second subset of the output indices of the plurality of encoding branches, and wherein the first subset of the output indices and the second subset of the output indices are interleaved with each other.

10. The method of claim 8, wherein the second subset of output bits is dependent on the first subset of output bits and bits input to the second encoding branch subset.

11. The method of claim 1, wherein the encoder is a linear block encoder.

12. The method of claim 1, wherein generating the first and second subsets of output bits of the codeword in first and second encoding operations comprises:
    inputting a first subset of the information bits of the information bit-vector and a first error detecting code generated from the first subset of the information bits to encoding branches of the first encoding branch subset for generating the first subset of output bits; and
    inputting a second subset of the information bits of the information bit-vector and a second error detecting code generated from the first subset of the information bits, the second subset of the information bits, or both the first and second subsets of the information bits, to encoding branches of the second encoding branch subset for generating the second subset of output bits.

13. An apparatus for encoding, in a system comprising:
    a processor;
    memory in electronic communication with the processor; and
    instructions stored in the memory and operable, when executed by the processor, to cause the apparatus to:
        divide a plurality of encoding branches of an encoder into at least a first encoding branch subset and a second encoding branch subset, outputs of the first encoding branch subset being independent of inputs to the second encoding branch subset;
        generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset;
        output the first subset of output bits prior to outputting the second subset of output bits; and
        transmit, via a wireless communication channel, the first subset of output bits prior to transmitting, via a wireless communication channel, the second subset of output bits.

14. The apparatus of claim 13, wherein the instructions are further executable by the processor to:
    receive a first of a plurality of subsets of the information bits of the information bit-vector prior to receiving a last of the plurality of subsets of the information bits from the information bit-vector.

15. The apparatus of claim 14, wherein the outputting of the first subset of output bits is performed prior to the receiving of the last of the plurality of subsets of the information bits of the information bit-vector.

16. The apparatus of claim 13, wherein the instructions are further executable by the processor to:
    receive the information bits of the information bit-vector for generating the codeword at a constant rate.

17. The apparatus of claim 13, wherein the instructions are further executable by the processor to:
    receive the information bits of the information bit-vector for generating the codeword at a variable rate.

18. The apparatus of claim 13, wherein the instructions are further executable by the processor to:
  determine a code rate for the encoding by selecting a number of frozen bits for input to the plurality of encoding branches.

19. The apparatus of claim 13, wherein the instructions are further executable by the processor to:
  perform bit-reversal on input indices of the plurality of encoding branches relative to corresponding output indices of the plurality of encoding branches prior to the dividing of the plurality of encoding branches.

20. The apparatus of claim 19, wherein a first subset of the bit-reversed indices correspond to the first encoding branch subset and a second subset of the bit-reversed indices correspond to the second encoding branch subset, and wherein each bit-reversed index in the first subset of the bit-reversed indices has a higher number than each bit-reversed index in the second subset of the bit-reversed indices.

21. The apparatus of claim 20, wherein the first subset of output bits correspond to a first subset of the output indices of the plurality of encoding branches and the second subset of output bits correspond to a second subset of the output indices of the plurality of encoding branches, and wherein the first subset of the output indices and the second subset of the output indices are interleaved with each other.

22. The apparatus of claim 20, wherein the second subset of output bits is dependent on the first subset of output bits and bits input to the second encoding branch subset.

23. The apparatus of claim 13, wherein the encoder is a linear block encoder.

24. The apparatus of claim 13, wherein generating the first and second subsets of output bits of the codeword in first and second encoding operations comprises instructions further executable by the processor to:
  input a first subset of the information bits of the information bit-vector and a first error detecting code generated from the first subset of the information bits to encoding branches of the first encoding branch subset for generating the first subset of output bits; and
  input a second subset of the information bits of the information bit-vector and a second error detecting code generated from the first subset of the information bits, the second subset of the information bits, or both the first and second subsets of the information bits, to encoding branches of the second encoding branch subset for generating the second subset of output bits.

25. An apparatus for wireless communication, comprising:
  means for dividing a plurality of encoding branches into at least a first encoding branch subset and a second encoding branch subset, outputs of the first encoding branch subset being independent of inputs to the second encoding branch subset;
  means for generating first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset;
  means for outputting the first subset of output bits prior to outputting the second subset of output bits; and
  means for transmitting, via a wireless communication channel, the first subset of output bits prior to transmitting, via a wireless communication channel, the second subset of output bits.

26. The apparatus of claim 25, further comprising:
  means for performing bit-reversal on input indices of the plurality of encoding branches relative to corresponding output indices of the plurality of encoding branches prior to the dividing of the plurality of encoding branches.

27. A non-transitory computer readable medium storing code for wireless communication, the code comprising instructions executable by a processor to:
  divide a plurality of encoding branches into at least a first encoding branch subset and a second encoding branch subset, outputs of the first encoding branch subset being independent of inputs to the second encoding branch subset;
  generate first and second subsets of output bits of a codeword in first and second encoding operations, the generating comprising inputting information bits of an information bit-vector and at least one frozen bit into respective encoding branches of the plurality of encoding branches and generating the first subset of output bits using the first encoding branch subset prior to generating the second subset of output bits using the second encoding branch subset; output the first subset of output bits prior to outputting the second subset of output bits; and
  transmit, via a wireless communication channel, the first subset of output bits prior to transmitting, via a wireless communication channel, the second subset of output bits.

28. The non-transitory computer-readable medium of claim 27, wherein the instructions are further executable by the processor to:
  perform bit-reversal on input indices of the plurality of encoding branches relative to corresponding output indices of the plurality of encoding branches prior to the dividing of the plurality of encoding branches.

* * * * *